United States Patent
Sozer et al.

(10) Patent No.: US 10,209,291 B2
(45) Date of Patent: Feb. 19, 2019

(54) SYSTEM AND METHOD FOR CONDITION MONITORING OF ELECTRICITY TRANSMISSION STRUCTURES

(71) Applicants: Yilmaz Sozer, Stow, OH (US); Jose Alexis De Abreu-Garcia, Akron, OH (US); John Lauletta, Hudson, OH (US)

(72) Inventors: Yilmaz Sozer, Stow, OH (US); Jose Alexis De Abreu-Garcia, Akron, OH (US); John Lauletta, Hudson, OH (US)

(73) Assignee: The University of Akron, Akron, OH (US)

( * ) Notice: Subject to any disclaimer, the term of this patent is extended or adjusted under 35 U.S.C. 154(b) by 170 days.

(21) Appl. No.: 15/426,038

(22) Filed: Feb. 6, 2017

(65) Prior Publication Data

US 2017/0227596 A1  Aug. 10, 2017

Related U.S. Application Data

(63) Continuation-in-part of application No. 15/424,779, filed on Feb. 3, 2017.

(60) Provisional application No. 62/291,690, filed on Feb. 5, 2016, provisional application No. 62/291,044, filed on Feb. 4, 2016.

(51) Int. Cl.
*G01R 31/08* (2006.01)
*E04H 12/00* (2006.01)

(52) U.S. Cl.
CPC .......... *G01R 31/085* (2013.01); *E04H 12/00* (2013.01); *G01R 31/08* (2013.01)

(58) Field of Classification Search
CPC ...... G01R 31/00; G01R 31/02; G01R 31/024; G01R 31/025; G01R 31/08; G01R 31/081; G01R 31/085; G01R 31/12; G01R 31/1227; G01R 31/1263; G01R 31/1272; G01R 31/281; G01R 31/2836; G01R 31/3193; G01R 31/327; G01R 31/3275; E04H 12/00
USPC ....... 324/500, 512, 522, 523, 525, 527, 600, 324/649, 691, 713
See application file for complete search history.

(56) References Cited

U.S. PATENT DOCUMENTS

| | | | | |
|---|---|---|---|---|
| 3,757,169 A | * | 9/1973 | Beresnikow | G01R 27/18 324/509 |
| 7,676,077 B2 | * | 3/2010 | Kulkarni | G06F 17/5045 382/144 |
| 8,013,600 B1 | * | 9/2011 | Yepez, III | G01N 27/9033 324/240 |
| 8,525,522 B2 | * | 9/2013 | Gong | G01R 31/086 324/519 |
| 8,558,551 B2 | * | 10/2013 | Mynam | G01R 31/086 324/522 |
| 8,909,762 B2 | * | 12/2014 | Wang | H04L 41/145 709/224 |

(Continued)

*Primary Examiner* — Hoai-An D. Nguyen
(74) *Attorney, Agent, or Firm* — Renner Kenner Greive Bobak Taylor and Weber; Ray L. Weber; Timothy A. Hodgkiss

(57) ABSTRACT

System and method for monitoring the condition of electricity conductor support systems, i.e. towers, in a power network distribution system employing a tower structure integrity sensor assemblage. The system allows for identifying particular portions of a structural system for maintenance attention. The tower sensors allow identification of structural failures of electricity transmission towers.

15 Claims, 15 Drawing Sheets

(56) References Cited

U.S. PATENT DOCUMENTS

2014/0002098 A1* 1/2014 Sales Casals .......... G01R 31/08
324/521
2014/0278161 A1* 9/2014 Chen .................... G01R 31/088
702/59

* cited by examiner

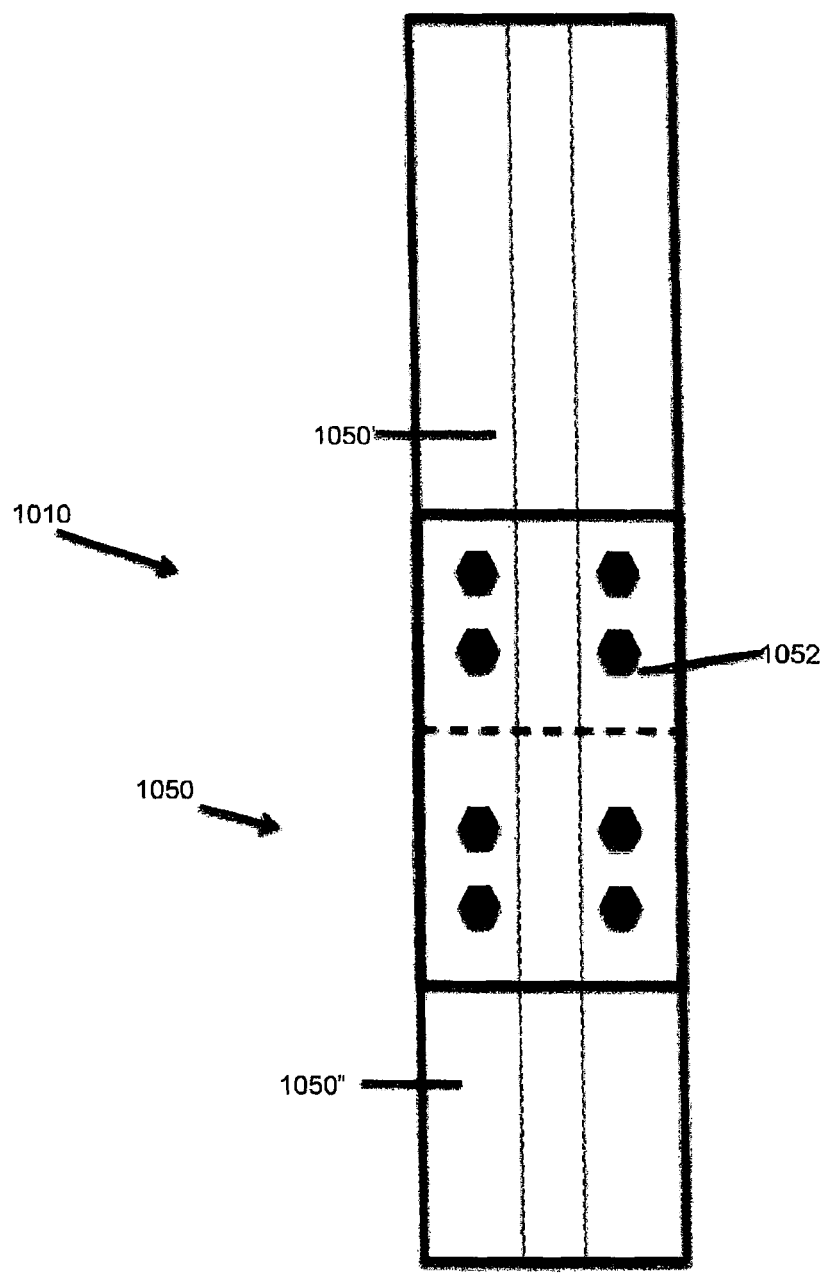

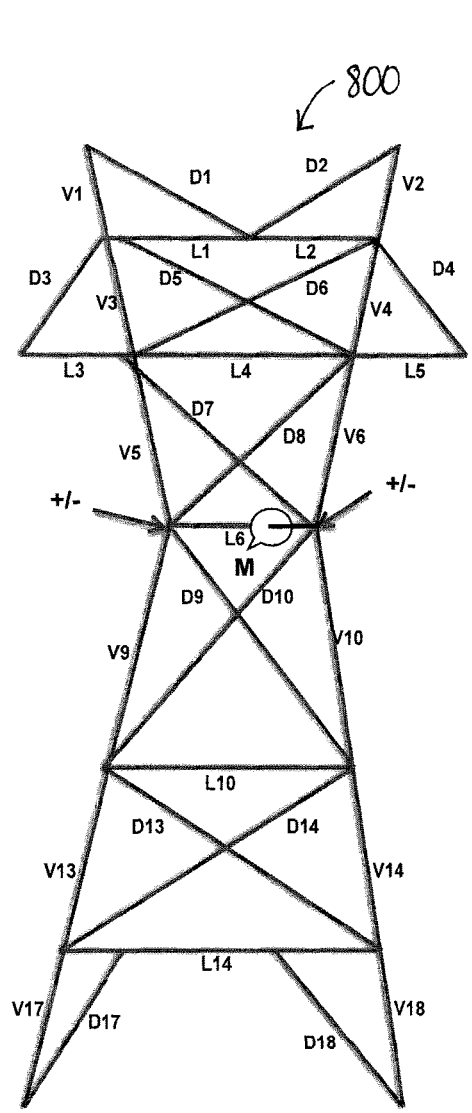
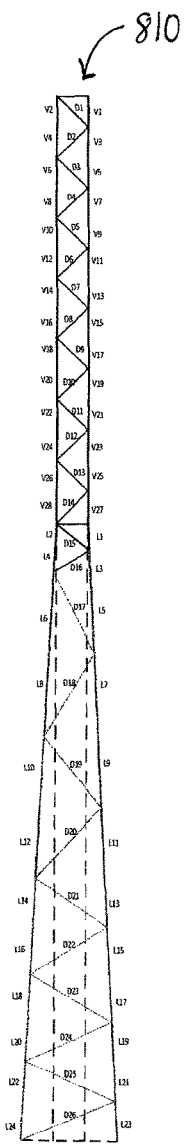
Fig. 8A
Fig. 8B

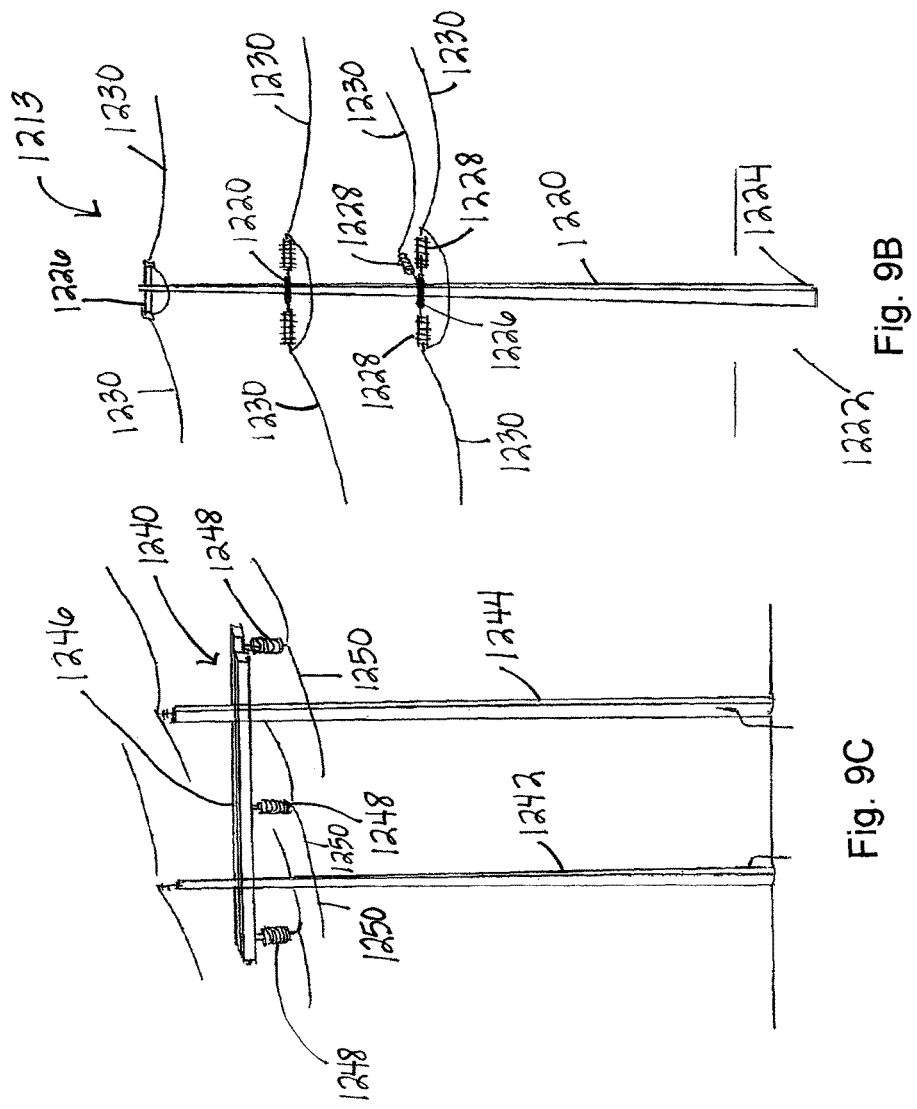

SYSTEM AND METHOD FOR CONDITION MONITORING OF ELECTRICITY TRANSMISSION STRUCTURES

CROSS-REFERENCE TO RELATED APPLICATIONS

This application the benefit of U.S. Provisional Patent Application Ser. No. 62/291,044 filed Feb. 4, 2016, and U.S. Provisional Patent Application Ser. No. 62/291,690 filed Feb. 5, 2016, the disclosures of which are incorporated herein by reference.

BACKGROUND

Electric utilities are the largest provider of energy to industrial, commercial and residential consumers. The infrastructure used to support the delivery of energy to the more than 100 million customers in the U.S. has been evolving for over 100 years. The electric power network or "power grid" is comprised of power generation systems, which are connected by an electricity transmission network to an electricity distribution network. Power generation systems typically include power plants, where electricity is generated by electromechanical generators driven by engines fueled by a form of combustion, or by some kinetic energy, such as water or wind. Alternative energy sources of power generation, such as photovoltaic or solar heat panels are also commonly connected to the power grid.

The electricity transmission network transfers bulk electricity originating from the power generating plants to local substations that are closer to electricity demand centers. The transmission network transmits electric power at high voltages, generally along overhead power lines. The high voltage transmission reduces the energy lost while in transit. Important components of the transmission system include electric conductors, structural support, and accessory elements, such as transformers, switches and insulators. Finally, the electrical transmission system or network connects to the electrical distribution network, which delivers electrical energy to the end-user or consumer.

The electrical distribution system transmits power from local substations to local consumers at lower voltages than the transmission network. The distribution network is commonly made up of 20 to 40-foot wooden or steel poles, which support and suspend power lines or conductors, disconnect devices, lightning arresters, capacitors, insulators, and a variety of pole line hardware elements. Power lines running between power poles are commonly referred to as "overhead lines." Distribution of electric power through underground power lines has also become increasingly common in recent years, though it can present substantial increases in cost beyond that of overhead lines. Together, the power generation system, and transmission and distribution networks, instantly deliver energy to all customers on an on-demand basis, allowing the myriad of electrically-powered products and services to be routinely utilized.

In certain situations, environmental, cosmic, or physical intervention against electric transmission or distribution structures has caused significant power outages, and for some specific events, these outages have been geographically extensive and caused outages of much longer than a few hours. On Aug. 14, 2003, a series of failures of electrical systems in the northeastern United States and the Canadian province of Ontario caused a large-scale blackout that knocked out power to more than 55 million people. At the time, the blackout was the largest in history, with more total wattage and more individuals affected by the blackout than any other previous outage. The blackout was caused primarily by computer and alert system failures, which permitted surges along overhead transmission lines in Ohio to occur, causing several transmission lines short after contacting trees or other foreign objects, leading to further cascading outages. A joint American-Canadian task force that was established to investigate the causes of the blackout pointed to the deteriorating condition of a major electric utility's system as one of the primary causes of the blackout. The event showed the importance of carefully monitoring and maintaining weak and vulnerable points in the electric grid.

Weather events can cause widespread damage, and knowledge of the condition of individual structures can be useful for avoiding outages, and for planning repairs. In 1998, an ice storm caused the collapse of hundreds of electric transmission towers in Quebec, Canada, while some parallel lines survived. In such emergencies full knowledge of the condition of individual towers would allow for an improved response by technicians. In the 1998 event, over one million customers (about half the population of Quebec) were left powerless, as a result of damage to more than 100 high voltage transmission lines and the collapse of over 3,000 transmission towers. Similarly, the electric distribution system was damaged including more than 300 damaged lines and 10,000 collapsed structures. Similar events are not rare, and information of the integrity of grid structures is essential for a measured response.

In a 2007 weather event, an ice storm affecting Kansas caused more than $100 million of damage to the power infrastructure, involving about 2,000 power poles, 8,000 spans of power conductor and re-fusing of about 5,000 lines and transformers.

In diverse regions affected by war and internal conflict, attacks on electricity transmission structures have resulted in extensive power outages. During the 1980's, anti-Soviet Afghan insurgents were paid to attack an electricity transmission line extending from Sorubi to Kabul. In a very short period of time, many transmission towers were demolished. The dispersed structures of the transmission line system were left unprotected and subject to vandalism.

Decades later the USAID invested $355 million on the "Tarakhil Power Plan" to improve stability of the Afghan power grid. In January 2016, a transmission line supplying electricity to Kabul, Afghanistan from neighboring Uzbekistan was attacked by insurgents. Insurgents destroyed a single transmission tower and damaged others that were located near a highway in a rural area in Baglan province. The result was a day long power outage in the populated Kabul region. Repair attempts were begun soon after, but were hampered by anti-personnel mines left behind by the insurgents. Electricity service was disrupted for weeks. The stability and safety of the electric power grid could be substantially improved by increasing the knowledge about transmission system condition and improved security to maintain integrity.

The distribution network or system is a single path for the delivery of energy to homes, businesses, and industry. It begins at the step-down transformer at a substation. The step-down transformer reduces the voltage of the circuit from transmission levels to lower distribution voltages. An involved conductor or conductors in the entire network is energized to the particular distribution voltage level to the connection with the distribution transformer which reduces the voltage once more to the appropriate low delivery voltage. For example, a typical home usually receives a voltage of 120 volts line to neutral or 240 volts line to line.

The electricity distribution network is increasingly separated from the electric power generation system. In most locations, electricity distribution is a regulated public utility. Distribution voltages are generally standardized at various levels, including, for instance, 69 kV, 34.5 kV, 17.2 kV, 12 kV, 7.2 kV, 4.7 kV, and 2.7 kV. These voltages are transformed near the location of consumption to 480, 240, and 120 volts for use in machinery, systems, and homes. The distribution system or network is made up of 20- to 40-foot wooden or steel poles from which are suspended power lines or conductors, disconnect devices, lightning arrestors, capacitors, insulators, and a variety of pole line hardware elements, each of which plays a crucial role in keeping the lights on and factories running.

Substations contain step-down transformers that reduce the voltage of the circuit from transmission levels to lower distribution levels. The transformers, insulators, lightning arresters, capacitors, wires, poles, and other parts of the electric grid must all work properly and in unison for consistent electric power to consumers to be maintained. Consistent power supply quality and levels requires efficient coordination between all elements of the system. Minor damage or deterioration to even seemingly small parts can have major consequences throughout an electric power grid. Power lines supported by power poles are referred to as overhead lines. The active function of the electrical system or network is defined and limited directly by the reliability of the multitude of components. There is a continuing need to provide relevant information on grid status while there is still sufficient time available for technicians to take appropriate action.

There are over three million miles of overhead and underground electrical distribution circuits in the U.S. that provide consumers access to electrical energy. Ninety percent of all interruptions to electrical service occur when elements of the distribution system break down. The distribution system is the delivery point for all utility customers, except for the largest industrial customers such as steel mills and automotive manufacturing plants. Large industrial customers purchase energy on a wholesale basis at transmission voltage levels of 138 kV, 230 kV, 345 kV, 500 kV, or 765 kV. These wholesale customers include other utilities that buy and sell power on the wholesale market.

If any of the hardware connecting, insulating, or protecting the distribution circuit or system fails, all of the loads downstream of the failure become affected. Sometimes a power outage occurs because there has been a problem such as a tree limb falling across a line or an animal causing an electrical fault by bridging across two conductors. However, equipment or component failure is the leading cause of distribution circuit failure. When an equipment or component failure occurs, the broken element must be located and replaced.

One type of equipment or component failure that is often a problem is the structures supporting conductors and other electric utility equipment. In particular at risk are electricity transmission conductor support towers. The towers supporting the highest voltage conductors are typically constructed from structural steel, and particularly structural steel shapes that are welded, bolted or riveted together. One problem with monitoring transmission tower integrity is that there are a wide variety of structural designs. Common tower designs include free standing multiple element trusses, and single or multiple beam towers supported by guy lines. Within the structural steel tower category, there is a wide variety of individual designs.

In addition there are towers constructed of metal tubes, i.e. steel or in certain instances of steel reinforced concrete. Wood poles oftentimes include a ground or lightning arrestor cable that functions as a conductor element.

Detecting incipient failures of the entire system, including transmission and distribution structural elements is important for maintaining grid reliability. The structural elements may suffer from fatigue, corrosion, wind induced stress, impact damage, vandalism or even intentional unauthorized disassembly. Each of these or other foreseen or unforeseen insults to the structures supporting the structural elements of the electric grid may lead to local or widespread power outages. It would be very useful to remotely or continuously monitor the condition of these structural elements.

Identifying potential failures in conductors varies with differing types of conductors, and the power carried by those systems. Underground 120/277 volt, AC, 60 Hz network cable and associated terminations and hardware are designed to be buried underground, in or out of a conduit. Jacketed LV type underground cable is typically comprised of a stranded copper core of 10-30 individual wire conductors, surrounded by an insulating layer, and covered with an impervious protective sheath.

A variety of systems involved in energy delivery utilize components that are capable of conducting electricity or responding to an electrical current, RF field, or inductive field. These systems, such as gas and oil pipelines are difficult to remotely monitor, and are also potentially highly hazardous if a failure incident should occur.

Currently available monitoring products have a relatively high base cost and require technical skill, devoted labor, and post-analysis to be effective. In addition, the effectiveness of these products also relies on the opportunistic discovery of an already failing circuit or structural element. Developing a system that allows for accurate and cost-effective predictive maintenance would be extremely beneficial to utility companies or other entities that conduct maintenance of electrical systems. Predicting and targeting system weaknesses before they can lead to major failures can help to reduce outages caused by deteriorated system components, and in turn likely reduce the chances of large scale blackouts caused by vulnerabilities in electrical grid components.

SUMMARY

The disclosure embodies a method for detecting and generally locating incipient faults at a structural component of an electrical power delivery system, specifically structures supporting electricity conductors, such as high voltage transmission line support towers, and structural components of the electricity distribution system. Structural components exhibiting a fundamental fault indicator and their location at a given segment of electricity conductor are to be identified for attention or repair.

The system comprises comprising the steps of providing a detector alert assemblage including a sensor input antenna, a computer controllable radio receiver having a data output, and a receiver providing position data; isolating a segment of electricity conducting structure isolating said detector alert assemblage about said segment of electricity conducting structure; receiving and processing said fault indicator output; propagating a test signal along a segment of electricity conducting structure and then detecting the signal values and classifying them as to fault probability to provide classified signal values, with position data to provide position associated fault probability values and submitting them to a fault storage function.

In general the method is embodied in a detector alert assemblage capable of detecting faults about a structural element capable of carrying an electrical signal, with the electricity conducting element typically comprising one or more of an electricity transmission conductor support tower, an electricity distribution pole, a wooden pole with conducting elements, a pipeline, a pipe, or a structural alloy member.

In a further embodiment the method further comprises a weather sensing assemblage having a weather output representing ambient temperature, humidity and barometric pressure; and said control computer is responsive to submit said weather output to said storage facility in conjunction with the submittal of said compiled merit values and position data.

The disclosure is also embodied in a system utilizing the method in conjunction with an apparatus, with the system being for detecting and generally locating incipient faults at a structural component of an electrical power delivery system exhibiting a fundamental fault indicator and located at a given position, comprising: a signal receiving assemblage, a computer controllable radio receiver having a data output, and a receiver providing position data; including at least one sensor input, a first computer controllable radio receiver operatively coupled with an antenna and a control computer including a digital storage facility and responsive when a said fault related parameter maintenance merit value is below a setpoint; and then submitting maintenance merit values to said fault storage function and utilizing such compiled data for alerting of an incipient fault. The system allows for using the control computer to submit said digital samples as raw data to the storage facility to develop a signature analysis capability.

In yet another embodiment, the system is utilized in conjunction with electricity conducting elements to detect when a non-conducting element is altered from its original configuration.

The present disclosure is addressed to system and method for locating and analyzing faults in electrical power distribution networks and the like. A control computer is responsive to control the one or more radio receivers to locate the detected fault output and compile maintenance merit values with global positioning system data for submittal to storage. With the system, displays or maps of fault phenomena may be published, the maintenance merit values giving an indication of the intensity and thus the criticality of fault phenomena.

Still a further embodiments, is a sensor for identifying or locating service incident faults relating to a structural component of an electrical power delivery system exhibiting a fault indication at a position, comprising the steps of providing a detector alert assemblage including a sensor input connection, a computer controllable communicator having a data output, and a receiver providing geographic position data; a signal emitter for propagating a current flow signal through one or more electrically conducting elements associated with the structural component, measuring the impedance of electrically conducting elements associated with the structure by propagating a current flow signal; recording a relative impedance of said conducting elements by measuring relative current flow signal for a given voltage; and monitoring the relative impedance of the structural component over time. The relative impedance signals can be collected to determine a fault signature associated with a change in relative impedance; receiving and processing such a fault signature; and then detecting said fault signatures and classifying them as to fault probability to provide classified signal values, correlated with position data to provide position associated fault probability values and submitting them to a fault storage function, so that a position related fault probability can be utilized to determine the location of an actual service incident, or predict a service incident.

The disclosed sensor system can be used for monitoring a segment of electricity conductor support structures using a propagated signal and comparing said segment of support structures to signals from related structures. The sensor of may further comprise identifying a service incident that is one or more of a structural failure, a structural degradation, a structural alteration resulting from human intervention, an electromagnetic phenomenon, and a weather event. The disclosed sensor system may be preferably be mounted on one or more of a high voltage transmission tower, a transmission tower, a electrically connected net on a non conducting structure, a metal electricity pole, a wooden pole with a conducting element attached, an antenna, a radio antenna, and a cellular telephone antenna.

Other objects of the disclosure of embodiments will, in part, appear hereinafter. The instant presentation, accordingly, comprises embodiments of the system and method possessing the construction, combination of elements, arrangement of parts and steps that are exemplified in the following detailed disclosure.

For a fuller understanding of the nature and objects herein involved, reference should be made to the drawings and detailed description that follow.

BRIEF DESCRIPTION OF THE DRAWINGS

These and other features and advantages of the present invention will become better understood with regard to the following description, appended claims, and accompanying drawings wherein:

FIGS. 7A-C are schematic views of a transmission line support structure or tower and components thereof;

FIGS. 8A-B are schematic views of different types of transmission line support structures or towers that include various conductive structural support elements;

FIGS. 9A-D are schematic views of different types of transmission line support structures or towers;

DETAILED DESCRIPTION

Figure 1:
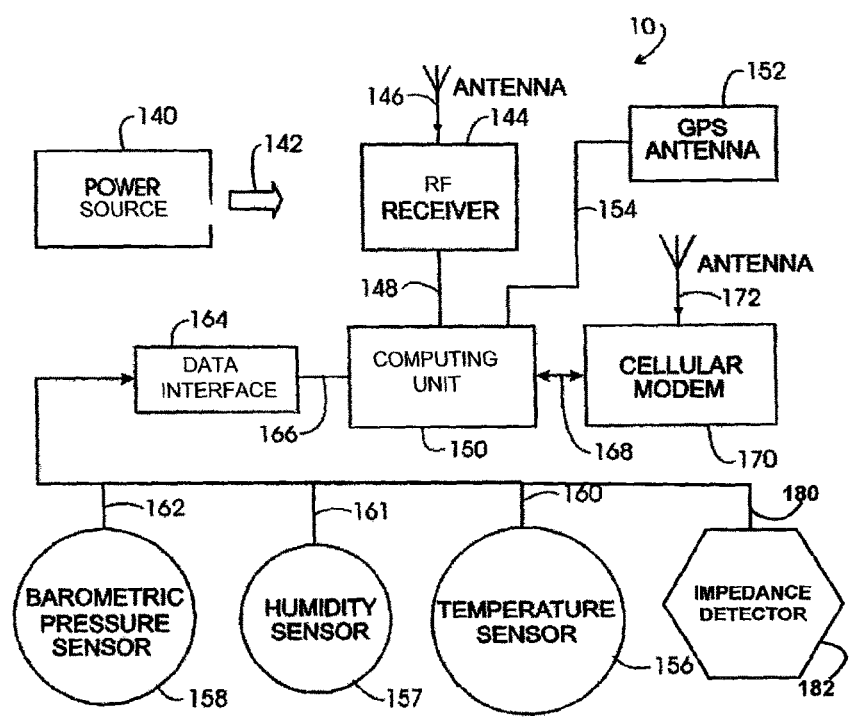
FIG. 1 is a block diagram of a condition monitoring system for transmission line support structures.

The power grid is one of the most important components of modern infrastructure, as society cannot effectively function without a reliable electricity supply. As additional supply components, such as solar and wind farms, are added to the electric grid, it continues to be important to identify potential sources of faults and respond to maintenance requirements in a proactive manner.

Without predictive sensors systems, utilities cannot proactively improve the grid without huge costs. Utilities must wait for an outage to occur before maintenance can be scheduled. This run-to-failure strategy is the most costly maintenance technique. The sensors will enable predictive maintenance on incipient failures and where a fault does occur, the location of the failed equipment.

The electricity transmission grid in North America is the most vulnerable and critical element in the reliable delivery of electric power. The North American grid is comprised of 440,000 miles of conductors supported by 4 million physical structures positioned throughout the 6 million sq. miles of the continent. Each structure is made up of line-hardware, insulators, ground connections, and a variety of mechanical elements. Each part plays a role in the continuous flow of power. Failure of these parts or contamination of insulating elements results in outages that reduce the overall reliability of the grid, cause outages, and in the worst cases results in cascading outages like what was experienced in the northeast U.S. in 2003 and California in 2011.

It would be enormously expensive to deploy conventional failure monitoring to the grid because of the breadth of the system. And this monitoring would only report on failures. Predictive condition monitoring of grid would allow utilities to plan for maintenance ahead of outages or equipment failures and reduce the number and severity of grid outages.

The present system is embodied in a variety of portable and independently operating detector alert systems. Grid reliability improvement is difficult because of the age of the infrastructure and the lack of condition monitoring. Each year electric utilities spend billions of dollars responding to outages and repairing the grid. Clearly, a smart sensor network that can provide actionable data allows for the implementation of predictive grid health monitoring and to correct incipient faults before power loss faults occur.

The system disclosed provides for site-specific conditions-based monitoring allowing for predictive maintenance of the electric equipment and conductors that make up the electric power grid. The underlying technology provides an effective geographic survey system to locate deteriorated equipment. The present disclosure provides similar technology integrated into low-cost sensors that can be applied to the grid in a variety of monitoring locations and reporting applications. The sensors will provide incipient failure and fault information on equipment and conductors for the transmission and distribution system. The use of grid condition information will enable predictive maintenance, outage avoidance, and real-time evaluation of the condition of the grid.

Equipment failure is the leading cause of outages on the transmission and distribution systems in the U.S. When equipment fails power outages result. Each year utilities spend significant resources to maintain the grid yet the number of outages increases. The increased number of outages is tied to the age of the electric infrastructure, higher demand for electric energy, and climatic changes that stress the aged networks. Electric utilities and large users of electrical energy can implement the detector alert systems to reduce maintenance costs, enhance worker safety and improve reliability. Without predictive sensors, utilities cannot proactively improve the grid without huge costs. Utilities must wait for an outage to occur before maintenance can be scheduled. This run-to-failure strategy is the most costly maintenance technique. The detector alert systems will enable predictive maintenance on incipient failures and where a fault does occur, allow for identification of the location of the failed equipment.

For purposes of this disclosure an incipient fault is a fault that is likely to 20 occur in a foreseeable time period. In general, faults include both degradation of the quality of component performance and a component failure that results in a component becoming entirely inoperative. Incipient faults can be monitored and scored, so that faults with a higher maintenance merit will be indicated by the system so that incipient faults can be graded according to their relative importance or priority. With respect to tower sensors, such sensors can be installed at critical locations, or even at all towers on a connected transmission line, and the fault status of towers can be continuously monitored. In a preferred embodiment of the disclosure, continuous monitoring of tower status allows for identification of an unexpected change in tower status, such as a change in relative impedance, 30 allowing for identification of damage or alteration to transmission towers even before a structural failure become irreversible. Comparison of the maintenance merit of an installed run of towers along a transmission line allows the rapid identification of an incipient failure in one or more towers displaying an unexpected tower status indication.

A condition monitoring system for transmission line support structures is referred to by numeral 10, as shown in FIG. 1 of the drawings. It should be appreciated that while the system 10 is discussed for use with transmission line support structures, it may be used with any structure having at least some structural component that is electrically conductive. Furthermore, the system 10 may be embodied in a variety of portable and independently operating detector alert systems. The condition monitoring system allows for providing a number of modular data inputs that are useful for assessing the status of the analyzed component, such as a transmission line support structure, including those used to support power transmission lines. However, the system 10 may be used to assess the structural health status of any conductive structural component.

Power to operate the system 10 is supplied by a power conditioning module or power source 140. In particular, the power source 140 may be derive power from one or more sources, including direct wiring to an electricity source, from batteries, from a solar panel, or from inductive harvesting or charging of power supply components directed to the components of the system at arrow 142. A radio frequency (RF) signal receiver or RF communication interface is represented at block 144, which is connected to an antenna 146. Received radio frequency (RF) data is delivered to the RF communication interface 144 by connection 148, whereupon such RF data is directed to computing unit 150. Additionally, the computing unit 150 is coupled to a position identification module as represented at block 152 and line 154. However, it should be appreciated that the module 152 may comprise any suitable position identification device, such as a global positioning system (GPS). The status of the electric grid is often influenced of affected by environmental conditions, which are monitored by one or more sensors, such as an ambient temperature sensor 156, a humidity sensor 157, and a barometric pressure sensor 158, for example. However, other environmental data, such as vibration, wind speed, position deflection based on load, and other status indicators may be monitored by the system 10. Such data are delivered to the computing unit 150 via a data interface, such as a USB (universal serial bus) port, as represented at block 164 and connection 166.

In addition, the system 10 provides for a transmission tower monitoring system that monitors tower status and structural integrity through use of an impedance detector 182, which is connected to an electrically structural portion of the transmission line support structure. As such, impedance detector 182 is connected by connection 180 to the computing unit 150 via data interface 164. It should be appreciated that the condition monitoring system 10 may include one or more of the sensors 156-158 in addition to the impedance detector 182. It should also be appreciated that the impedance detector 182 may also be referred to herein as a sensor.

The system 10 also allows geographic positioning data, radio frequency data, weather data, and tower status data to be gathered and communicated by the computing unit 150. Such communication may be transmitted through a connected cellular or wireless network through a processing function shown as dual arrow 168, to a cellular modem or wireless communication interface at block 170, through antenna 172. While cellular telephone communication is readily used with the system 10, any other suitable communication network or protocol may be utilized to communicate data to and from the condition monitoring system 10.

Figure 2:
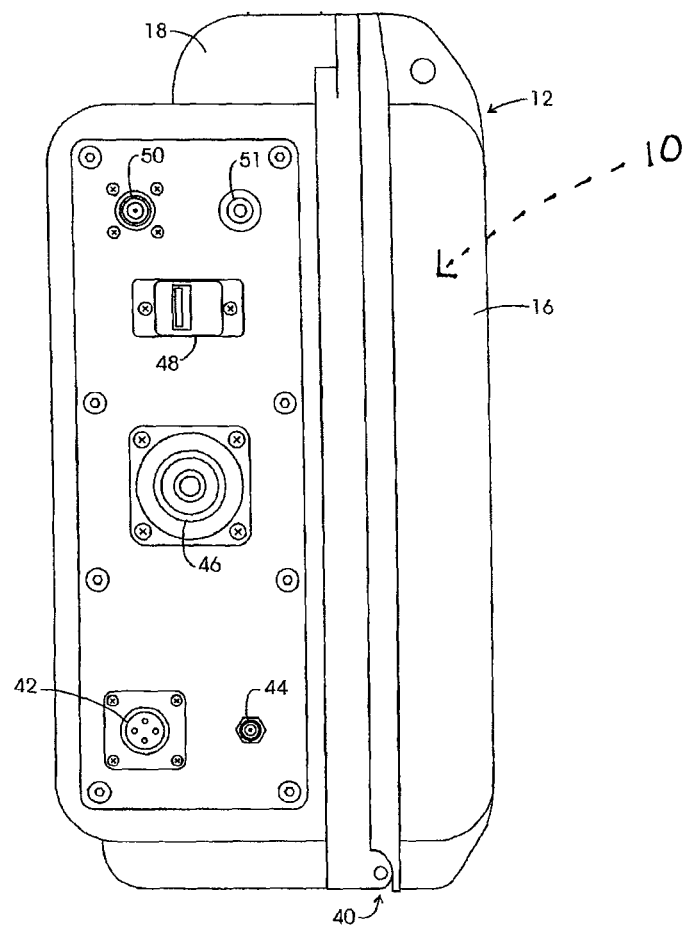
FIG. 2 is a side view of a case for the condition monitoring system.

In one embodiment, the condition monitoring system 10 may be embodied as a portable unit that is configured to be mounted to a structure. For example, the system 10 may be carried in a housing 12. In further embodiments, the housing 12 may comprise a case formed of components 16 and 18, which are hinged together and selectively retained in a closed orientation by latches. It should be appreciated that the housing 12 may comprise any suitable non-conductive material, such as a non-conductive polymeric material. The housing or case 12 is suitable designed to be resistant to environmental conditions, and the intrusion of water therein, so as to protect the components of system 10 therein. The housing 12 includes a power input connector 42, which is configured to be selectively coupled or hardwired to the power source 140. It should be appreciated that the power source 140 may include any suitable power source including mains power, inductive power, solar power, and battery power; and in some embodiments may be a fuse protocol. Adjacent connector 44 is provided for connection to the impedance detector 182 for measuring the impedance of various structural portions of the transmission line support structure or electrical tower in a manner to be discussed. Additional antennas can also be disposed in the interior of the case or housing 12, along with additional corresponding connectors. The pivoting or hinged connection between the components 16 and 18 is shown generally at 40. A cooling fan is provided at 46. Above the cooling fan 46 is a connector 48 by which antenna 152 is attached. In addition, a connector 50 is provided to which the radio frequency antenna 146 is attached. An output connector is also shown at 51. Each of the connections shown in FIG. 2, are intended to be coupled to internal components provided by the system 10 shown in FIG. 1, or alternatively as the particular application requires. In addition, the housing 12 allows the system 10 to be sealed and weatherproof, and communicate externally in a wireless manner through RF communications such as WiFi, Bluetooth™ or the like. Each system 10 can be configured with sensors and antennas as needed for a particular application.

Figure 3:
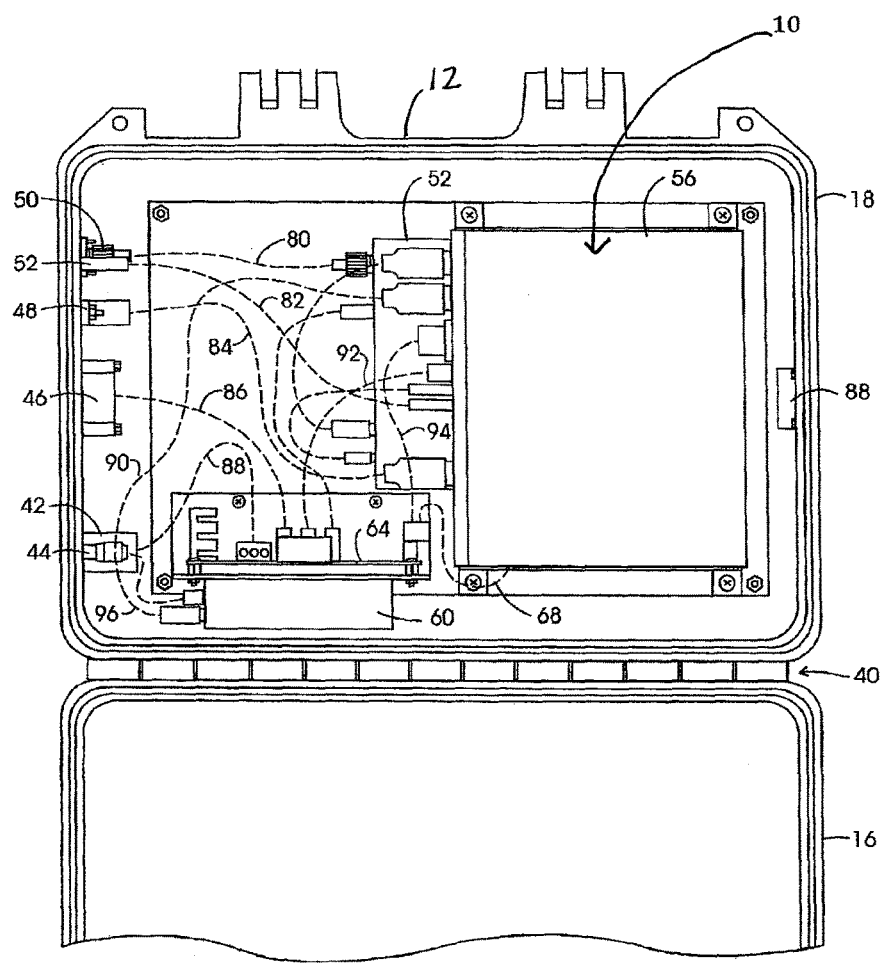
FIG. 3 is an elevational view of the case in an opened configuration to access the condition monitoring system.

Continuing to FIG. 3, the interior of housing 12 is shown by way of example, with various components contained within case components 16 and 18. In the figure, symbolically, wideband radio antenna connector 50 reappears along with GPS 25 receiver 48 and impedance connector 44. Cables, such as cable 80 extend from an external antenna (not shown) as a line extending to the wideband antenna input of a wideband radio receiver represented in general at 52. Receiver 52 may be provided, for example, as a IC-PCR 1500 communications receiver marketed by Icom America, such as the receiver shown at the internet location at http://www.icomamerica.com/product/receivers/per1500/specs.asp. Receiver 52 is controllable by a control computer represented at box 56. Computing unit 150 may be provided as an Ampro Ready System™ 2 U Computer, marketed by Ampro Computers, Inc. of San Jose, Calif. Also extending to the computing unit 150 are connections to the GPS receiver and to a cellular modem represented at block 64. The association between cellular modem 64 and computing unit 150 is represented at line 68. Cellular modem 64 may be a type MTCBA-C marketed by Multi-Tech Systems, Inc., of Mounds View MN.

Particular systems 10 will vary depending on the particular application or installation site. Block 60 represents the tower impedance detector or sensor 182, and by analogy other provided sensors 156, 157, 158, such as vibration, barometric pressure and wind speed, for example. Additionally, a circuit association of components is shown by dashed lines. In this regard, a dashed line 80 is shown extending between the connector for a radio frequency antenna 36 and wideband radio 10 receiver 52. A dashed line representing input/output is shown at 82 extending from external connector 51 to computing unit 150. GPS input to the computing unit 150 is shown at dashed line 84. Power is shown supplied to fan 46 as represented at dashed line 86. Power-in supply as earlier described at connector 42 in connection with FIG. 2, is shown connected with board 64 as represented at dashed line 88. It should be appreciated that other provisions for the power supply may also be disposed inside case 12, as is warranted. Connection between cellular modem at 64 and computing unit 150 is shown at dashed line 90. Power-in to control computing unit 150 is represented at dashed line 92, while power monitoring is represented at dashed line 94. A communication of impedance monitor 60 with connector 44 is represented at dashed line 96.

The condition monitoring system 10 may utilize any desired sensing technology. In one embodiment, EXACTER® failure signature analysis of partial discharge (PD) and electromagnetic interference (EMI) emissions from the energized components of the transmission line support structure may be utilized, as disclosed in U.S. Pat. No. 7,912,660, by Anderson, et al., issued Mar. 22, 2011, the disclosure of which is incorporated herein by reference. Such emissions are correlated with ultrasonic emissions that are created by electrical arcing and cracking of electrical components. Other sensors may include strain gauges, Rogowski coils and other sensor technologies utilized for the purpose of condition monitoring. Further sensors may also be utilized with the system 10, including motion sensors, cameras, and video equipment. Sound detection may also be incorporated into the system 10, through use of microphone, ultrasonic sensors, and the like. Operation of the sensors, analytical processes and communication systems may be optionally powered by rechargeable batteries that are connected to low power solar panels, however any suitable power source may be used.

It is an object of the system 10 to provide condition monitoring data regarding power grid components, including the transmission line support structure, on a continuous or periodic basis. Recording regular information on the condition of transmission line facilities provides valuable input into planned line outage schedules, the resolution of unknown line trips or faults that stress the power grid, and maintenance 5 planning for insulator cleaning and replacement.

The system 10 provides predictive equipment condition analysis, along with fault and incipient fault detection, while also allowing for the identification of the location of such faults. By utilizing predictive failure signature algorithms, a correlation of data can be collected in a database of grid equipment condition analytics relating to the reliability of failure 10 prediction. The sensors are configured with common elements and application specific extensions, to enable wide distribution of the detector alert components on utility transmission and distribution system components.

An advantage of the sensors coupled to system 10 is their continuous operation, low-cost, and simple installation. Such design allows for use existing utility data networks, cellular connection, or other robust communications network. The detector alert modules themselves may optionally operate independent of utility power supply providing final failure information following an outage. The predictive alert capabilities utilize algorithms that allow for scheduling maintenance as the condition of equipment degrades, but prior to actual fault.

System 10 is embodied as one or more related types of sensor systems, with such sensor systems having one or more types of data sensors useful for monitoring electric power grid status and the status of electrically conducting structures, such as transmission line support structures. As disclosed in FIG. 1, a barometric pressure sensor 158, a humidity sensor 157, a temperature sensor 156, and an impedance sensor 182 are examples of the types of sensors that may be used by the system 10 to gather data. As previously discussed, the system 10 may be configured to include the impedance detector or sensor 182, and optionally one or more of the sensors 156-158.

Figure 4:
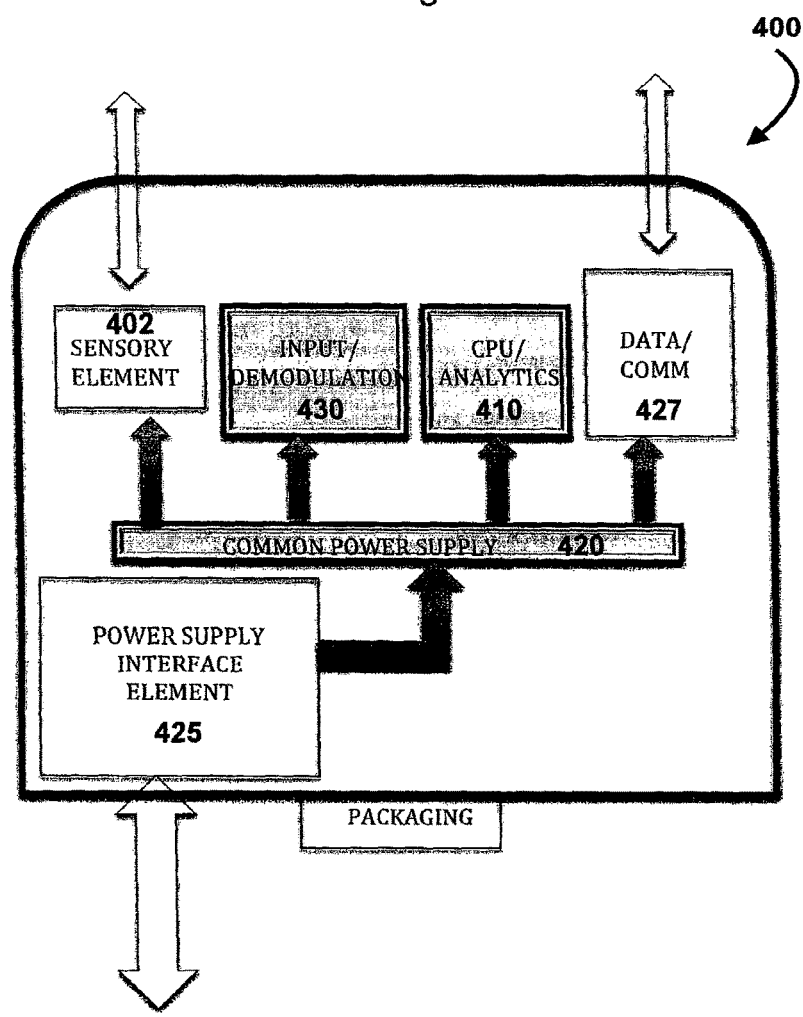
FIG. 4 is a block diagram of various system modules utilized by the condition monitoring system.

As shown in FIG. 4, a high-level representation of the functional blocks or components of the system 10 are identified by reference numeral 400. The functional blocks (modules) 400 allow much of the technology used by the system 10 to be universal for many applications, and the implementation of various sensors for divergent applications. The overall sensor package 402 (i.e. sensors 156-158 and 182) may be constructed similarly to those shown in the Figs. or adapted for particular installations or mounting needs, such as sensor system 660 or 664. The sensor system 400 includes the computing unit 150, at block 410, a power supply 420, for the various system elements, and an input interface/demodulation unit 430, to interact with the various sensor inputs provided. The processor 410 may be programmed, or be programmable to perform analytics, and release alerts, or to function as a data collector only, depending on the particular installation.

A power interface element module 425 depends on the available power sources, and the interface module configured to deliver an appropriate electric power supply to the system. It is preferred that an inductively charged battery system is implemented inside the apparatus case 12. Likewise, the data communication components 427 are configurable. In a preferred embodiment, the data is transmitted from the detector apparatus or system 10 through WiFi or Bluetooth, or any other suitable communication protocol, to existing data networks to a remote computer or other computing device, such as a portable computing device for example. In addition to the elements described above, the input interface 430 is connected to at least one sensor element. The particular sensor used will depend on particular demands of a location for the system 10. For example, as previously discussed, the sensors utilized by the system 10 may include one or more of the impedance detector/sensor, the wind speed sensor, the vibration sensor, the displacement/disturbance sensor, the EMF (electromagnetic field) sensor, the temperature sensor, the barometric temperature sensor, or any other suitable sensor.

Figure 5:
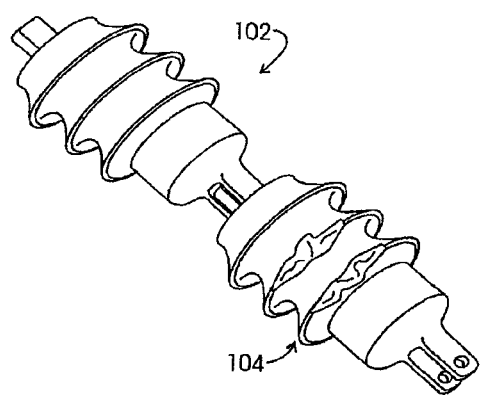
FIG. 5 is a perspective view of a distribution network insulator component which is defective.

As one example of fault detection performed by the system 10, a fault indication in the form of electrical arcing may occur in connection with a broad variety of components or structures within the power distribution network. The fault results in creation of an electric arc that may be detectable through a number of signals, such as a radio frequency (RF) interference condition, which is often a precursor to the physical breakdown of structures within a transmission or distribution network. Such arcing and subsequent breakdown can occur in conjunction with a broad variety of network components. One example of a failed component is represented in FIG. 5 showing a damaged insulator 102. Such insulators 102 may, for example, support a 13.5 kV conductor. Given the damage of the insulator 102 represented as numeral 104, the electric field surrounding the insulator 102 will begin to leak through the broken region and partial discharge, such as RF discharge, near the sharp edges of the fracture will emit specific signals detectable as electromagnetic interference (EMI). Thus, it is one object of the system 10 to detect such defects or damage 104, so they can be corrected. Left uncorrected, the end result of a degrading insulator component 102 would be an arc flashover across the insulator, resulting in a system fault and an outage within the distribution circuit or power grid. A detailed review of such component defects is provided in the following publication: Loftness, "A.C. Power Interference Handbook", Second Edition Revised, 2003, Percival Technology, Tumwater Wash. 98501.

In addition to monitoring of the occurrence of faults such as that demonstrated in FIG. 5, condition monitoring achieved by the system 10 could include, for instance, insulator contamination; insulator damage; loose or degraded power line-hardware; ground currents; structural stress and strain, structural failure; incipient weather parameters; conductor sag; proximity alerts of invasive elements, such as animals, vegetation and impact; and vandalism alarms and physical grid security monitoring.

One embodiment of the system 10 is a predictive sensor to monitor and evaluate the condition of equipment on transmission line support structures. Sensor algorithms exist to predict and detect electric incipient equipment failure and faults can be evaluated in near real-time. Other location specific sensors include substation equipment, protective equipment, and underground vaults at the system and individual component level. The sensors may utilize a common analysis platform and be compatible with standard utility communication protocols and mounting requirements. The power grid condition sensors include: transformer/breaker bushing sensors; substation area sensors; insulator contamination sensors; conductor damage sensors; station battery sensors; underground vault sensors; electrical cabinet sensors; and transmission structure sensors.

Figure 6:
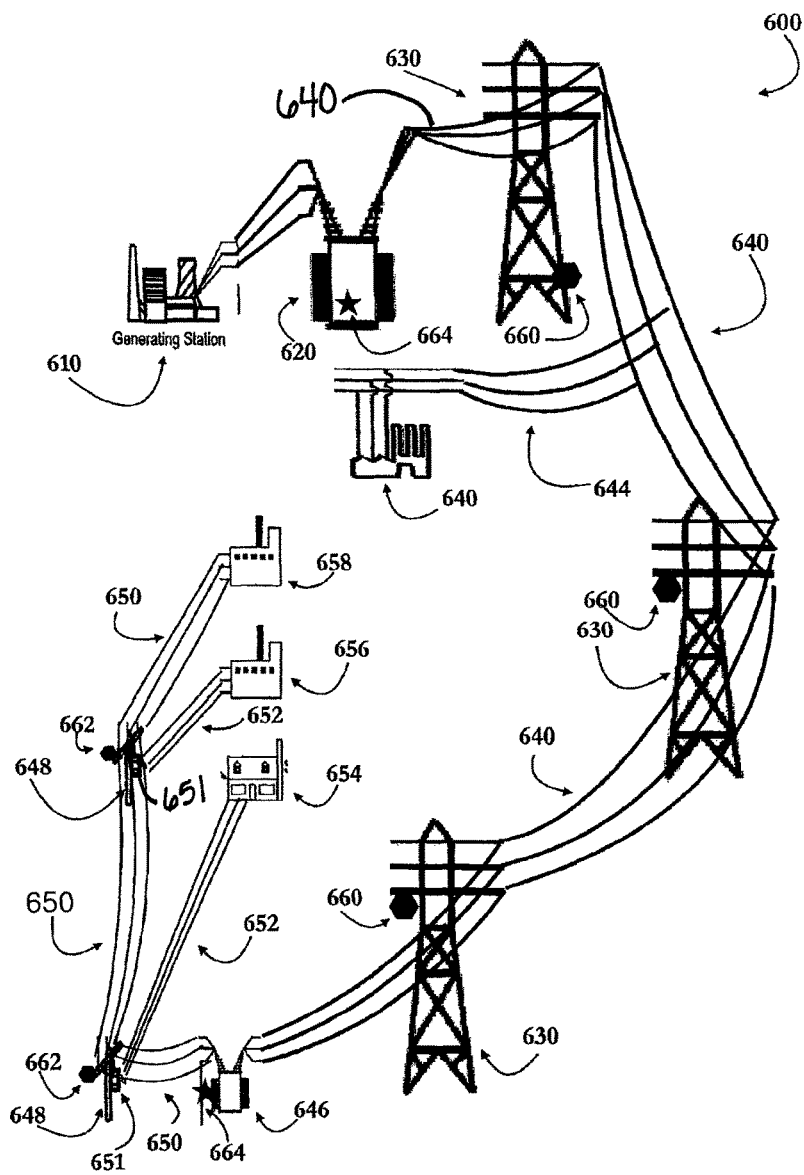
FIG. 6 shows a schematic view of an electric power grid and components thereof.

The power grid is a complex interconnected system that is exposed to the 25 environment. Electric energy is delivered to customers through two distinct yet interconnected networks: the transmission system and the distribution system. These systems, shown in FIG. 6, comprise structures, electrical equipment, conductors, cables and related and accessory components. The failure of these various equipment and structures results in power outages. FIG. 6 shows a 30 schematic representation of exemplary locations for the use of the monitoring system 10 to improve power grid reliability and improve maintenance efficiency and security thereof.

In FIG. 6, the exemplary power grid system 600 is powered from a single power generating station 610. The power generating station 610 is connected to a transmission line through transformer 620. Transmission line transformer 620 feeds a series of transmission lines 640, which eventually are the source of electric power for a variety 5 of utility customers. That is, transmission towers or transmission line support structures 630 support long runs of transmission line conductors 640. Certain customers, such as heavy industry 640 are fed directly from the high voltage transmission lines 640, by branch circuit 644. It should be appreciated that the branch circuit 644 includes a branch switching station (not shown). Transmission lines 640 eventually lead through, and are physically supported by, a series of transmission towers 630 to a step down substation, as represented by step down transformer 646, feeding distribution lines as conductors 650, supported by distribution line poles 648. Certain customers may be fed higher voltage power directly from distribution lines, such as customer 658, or through a step down transformer 651 and feed lines 652 to customers 654 and 656.

The system 10 provides status sensors 660 mounted in the vicinity or directly on the structure of transmission towers 630. It should be appreciated that the tower status sensors 660 include one or more of the sensors/detectors discussed herein, including but not limited to the sensors 156-158 and impedance detector 182. The mounting location in relation to such towers may be varied in relation to local conditions or requirements of the sensor. A variant of tower sensor 660 may be provided on distribution structures, such as sensor 662 on distribution poles 648. It should also be appreciated that alternative sensors may be installed at transformer stations as station 620, or at step down substations, such as sensor 664 at substation 646.

Accordingly, the system 10 seeks to monitor the structural integrity of various conductive structural components forming transmission line support structures or tower by monitoring and analyzing the electrical behavior of the tower structure. The modular system 10 analyzes the integrity of the electrically conductive structure forming the transmission line support structure or tower by monitoring the electrical impedance or changes thereof in such structure. An impedance model of an individual tower structure can be created by measuring the relative impedance of the electrically conducting elements of the tower structure. For additional background on the electrical behavior of transmission towers see the disclosures in the following publications:

Chen, B., Guo, W. H, Li, P-Y, and Xie, W-P. "Dynamic Responses and Vibration Control of the Transmission Tower-line system: A State-of-the-Art Review." The Scientific Workd Journal, Vol. 2014 (2014).

Vinay, R. B., Ranjith, A., and Bharath, A. "Optimization of Transmission Line Towers: Delta-P analysis. International J. Innov. Res. In Sci. Eng. & Tech. 3:7 (2014).

Kato, S., Mochizuki, A., and Zama, E. "Transmission Line Tower Models in Frequency Domain." Elec. Enfg. In Japan. 117:2 (1996).

Xu, K. J., Yang, L., and Wang, D. D., "Parametric Finite element Modeling of Overhead Transmission Line Towers."

Transmission line support structures or towers are defined as a structure that suspends an electricity conducting element. That is, transmission line support structures support one or more conductors that are part of the electricity transmission component of the electric power grid, and typically carry high voltage alternating current (AC). For purposes of this disclosure, the definition of transmission line support structures or towers extends to other structures that may be part of the power generating system or the distribution system of the power grid. Those skilled in the art will recognize that many elements of the system 10 are directly applicable to other structural components of the electric power grid. Outside the United States, transmission towers are often termed "pylons" and for purposes of this disclosure pylons are version of transmission towers. To the extent that the distribution system uses structures that are similar to transmission towers, the disclosed system is similarly applicable to those structures.

In one embodiment, a transmission line support structure is comprised of an integrated structural steel lattice that supports at least three conductors. However, such structure may be formed of any electrically conductive material. (Three conductors are necessary for carrying each three-phase electric circuit.) Such lines will commonly be carrying alternating current of from 66 kV to 280 kV, and rarely up to 500 kV or 765 kV. Installation of transmission towers commonly provides for support of more circuits than are currently required, and on some occasions, conductors are strung during installation that are not energized until a later date. As a practical matter, it is difficult, if not impossible, to install additional conductors on a transmission tower while a conductor supported by a tower is energized. Parallel circuits comprising multiple independent conductors supported by a common transmission tower is routine, with the same tower capable of supporting 110 kV circuits and 220 kV circuits, for instance. As electrified railroad power supplies for electric traction locomotives are commonly 110 kV, parallel circuits for 110 kV traction power and 220 kV consumer electric power distribution are also compatible.

Figure 7A:
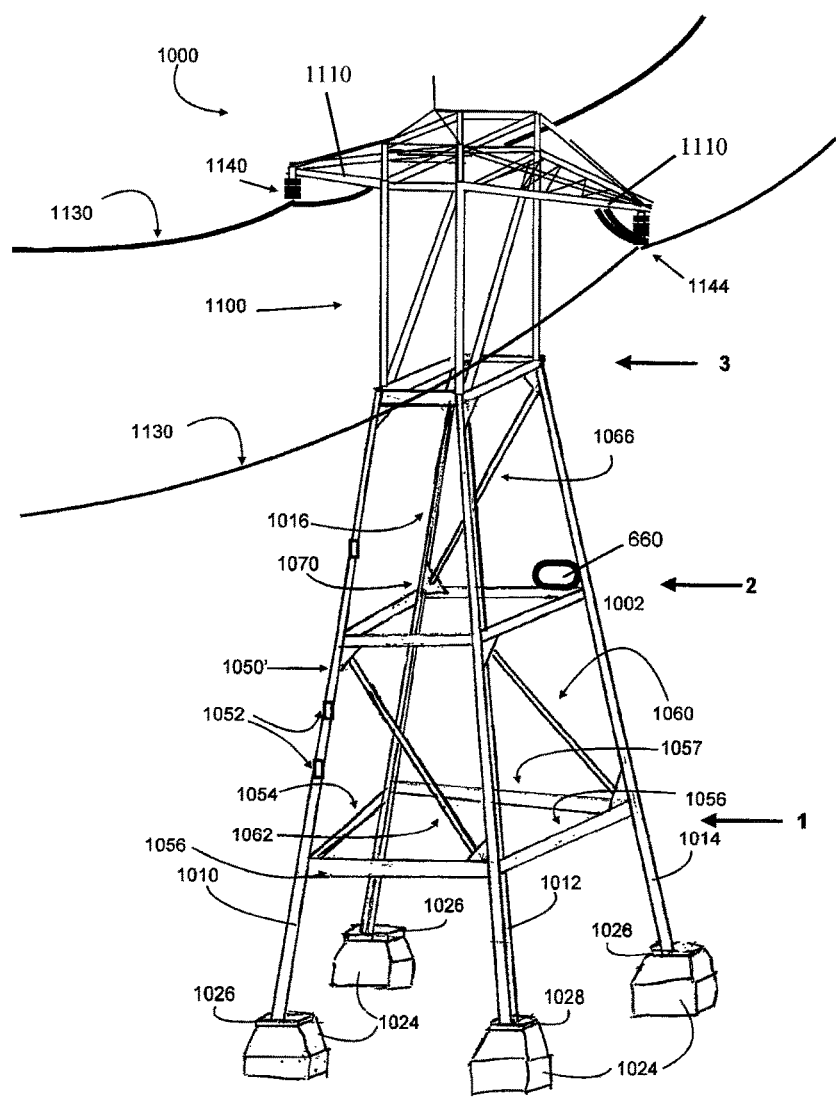
Figure 7C:
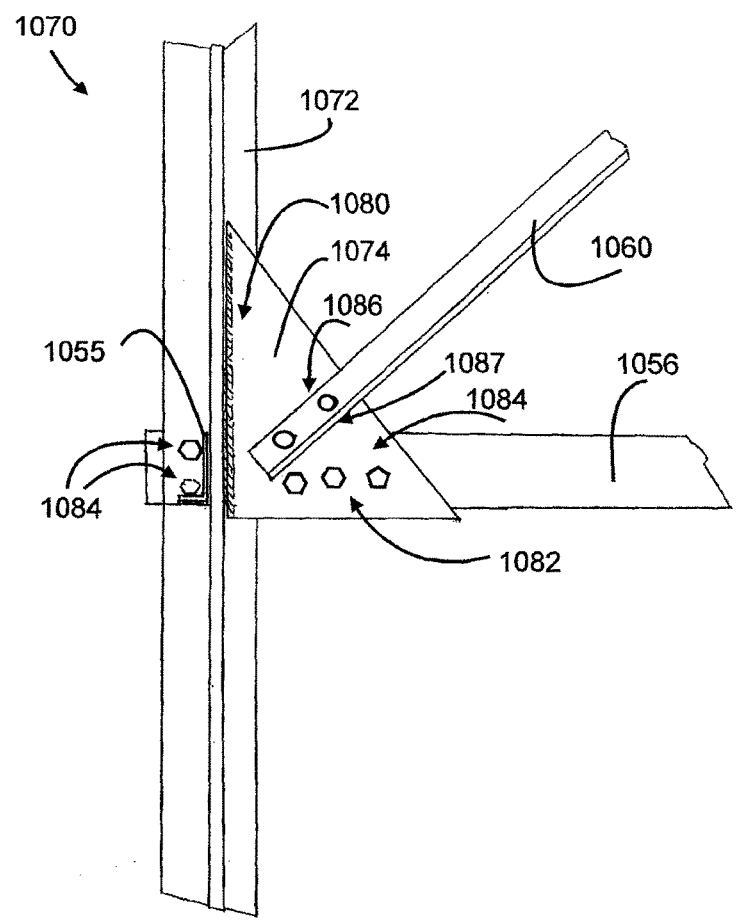

Steel lattice transmission towers are particularly common. Such towers may be constructed of structural steel shapes such as "L" beams (steel angle) and 5 "T" beams. FIGS. 7A-C illustrate the structural elements common to many steel lattice transmission towers. Transmission tower 1000 has four leg elements 1010-1016 (i.e. legs) that form boxed tower body segment 1020. Each of the four leg elements is supported by a foundation contact 1024 that is fixed to a tower shoe or base 1026-1032. The foundation contact may be a poured concrete pedestal, or a direct mounting to bedrock strata. Other types of steel transmission towers may be used, including towers with three legs, for instance. As one example as shown in FIG. 7B, a transmission tower leg such as leg 1010 can be further comprised of a T beam vertical member 1050 that is further comprised of one or more joined sections 1050' and 1050" which is joined by plate 1052 using fastener bolts 1053.

Affixed to the vertical member 1010 are three pairs of horizontal cross members 1054-1056 and six or more pairs of sway brace members, such as sway brace member, i.e. diagonals 1060-1066. For purposes of illustration, not all diagonals that would typically be present are shown in FIG. 7A. The four leg elements, along with associated crossmembers and sway brace members are joined together, by bolting, riveting, or welding, for instance. Tower base bracing and truss structure can vary across a wide spectrum, including for example utilizing a Warren truss, Pratt truss, portal bracing, a double web bracing system, diamond bracing and combinations of these and other truss types. As shown in FIG. 7A, the disclosed structure has been simplified for increased clarity.

FIG. 7C shows a junction 1070 of the several elements of the tower leg segment 1072 with additional reinforcing gusset 1074. Such gussets may be welded to tower leg vertical member 1072 along weld 1080, or bolted as at bolt joint 1082, by bolts 1084, or less commonly in current construction, riveted as at rivet joint 1086, by rivets 1087. Attached at the junction 1070 are cross members 1055 and 1056, gusset 1074 and sway brace 1060. Other arrangements in tower construction are well known to those skilled in the art. The tower shown in FIG. 7A has four levels of generally horizontal lateral members, such as the level including lateral cross members 1054-1057. Each of these levels of lateral cross members can be considered a node on the structure, as represented by nodes 1, 2. 3, and 4 in FIG. 7A. For additional background and disclosure regarding transmission tower structure, see the "Transmission Line Reference Book, 2nd Ed. Project UHV, Electric Power Research Inst. Palo Alto, Calif. (1982), the disclosure of which is incorporated herein by reference.

When transmission line support structures or towers are erected, they commonly are assembled at the installation location, through use of a crane to assist, although some subassemblies may be provided by the tower manufacturer. It should be recognized that many towers are erected at difficult to access geographic locations, and erection may be assisted by helicopter lifts. Where the weight of tower components is a particular concern, metals or composites other than steel may be used to form the structural components of the transmission line support structure or tower components, such as aluminum or carbon fiber composite components.

Joined to the top of the tower segment is a conductor box cage 1100, as shown in FIG. 7A. In one embodiment, the cage 1110 maybe shaped as a cuboidal polyhedron. The cage 1110 supports one or more conductor arms or beams 1110. Depending on the loads placed on the conductor arms, such arms may be simple shapes such as 1110 or more intricate steel lattice beams 1110. The conductor arms support the conductors 1130, and to avoid a short circuit, the conductor arms 1110 suspend the conductors 1130 from a series of insulators, such as insulator column 1140 or insulator truss 1144. Crowning the tower suspension cage 1100 is a peak or spar that provides a location for mounting lightning arrestor equipment, a ground wire, antenna, or the like. The tower cross arm 1110 is the location where insulator trees 1140, 1144 and electricity transmitting conductors 1130 are attached. The structure of the cross arm 1110 provides for separating the energized conductor lines from the tower structure. The number of cross arms 1110 and their configuration depends on the particular application. For simplicity, the tower structure shown in FIG. 7A has only a pair of cross arms 1110 although three cross arms to carry two three-phase high voltage circuit would be more typical. Additionally, the number of insulators and their configuration will depend on the voltage of the conductor line carried by the arm, with higher voltage requiring additional insulator capacity.

High-voltage transmission towers include suspension towers, such as tower 5 1000 in FIG. 7A. On "suspension" towers, the high voltage conductor lines are suspended from insulator clusters that are suspended from the tower structure. In general, suspension towers tolerate only minimal lateral displacement of the suspended conductor or transmission lines, up to about 5 degrees of deflection per tower. The suspension tower or support structure is designed to support only the weight of suspended conductor or transmission line. Most structures on a high voltage transmission line are suspension towers.

Tension or "angle" transmission towers or support structures are used where the angle that a transmission line deviates from a straight line of more than about 5 degree. Such towers are constructed based on the amount of conductor deviation that is being carried by the tension tower, in addition to the weight of conductor alone. In addition, for some installations, special towers are designed to meet a particular need, such as when crossing a large body of water or geographical barrier. For each of the tower type, the tower sensors disclosed herein provide for an ongoing or routine evaluation of a tower's structural status, and deviations from the expected impedance readings, for instance, can be interpreted in light of accumulated status data.

As described, it is clear that the structure of a steel lattice transmission tower is quite complex. It is not possible to predict without experimentation the relative impedance of a particular tower structure simply by examining the components that make up the tower. Moreover, the location of the impedance detector 182/660, as mounted on a tower or support structure, can affect the measured relative impedance, along with the proximity of other elements, such as ground, conductors and other sources of electromagnetic signal. When assessing the relative impedance of a transmission tower, such measurement is directly affected by the structure of the junction between structural elements, for instance as shown in FIG. 7B, and by the nature of the joints between elements, and the electrical integrity of those junctions. Thus, the system 10 utilizes the impedance detector 182 to provide a measure of changes in impedance over time, or alert to significant alterations in the complex structure, and changes in the junctions within the structure.

When the condition monitoring system 10 is utilized to monitor the impedance or change in impedance of the transmission line support structure 1000 or portion thereof, the impedance detector 182/660 is used. The impedance detector 182/660 includes a voltage generation component that applies an alternating current (AC) voltage signal, of any suitable frequency to the tower structure or portion thereof. It should be appreciated that in some embodiments, the frequency of the AC voltage signal may by a high-frequency or a low-frequency voltage signal. As a result of the applied voltage, an AC electrical current is induced in the tower structure or portion thereof, which propagates through the structure, and eventually reach a ground terminal associated with the voltage component of the system 10. For example, a ground 1024 may be reached through element 1010, or by return through a electrical lead of the system 182/660 representing ground. That is, the induced electrical current is transmitted through the conductive structure 1000, or a portion thereof, such as portion between a positive and a ground terminal of the voltage generation component of the impedance detector 182/660. The induced electrical current may be measured by a current detector component provided by the impedance detector 182/660. Based on the applied voltage and measure current, the impedance of the structure 1000, or portion thereof under evaluation, can be identified using known techniques, as well as the formula $Z=V/I$, whereby Z is impedance, V is the voltage applied to the structure, and I is the electrical current through the structure. It should be appreciated that the data associated with calculating the impedance may be performed remotely upon the wireless communication of the collected data by the system 10.

The impedance value measured by the system 10 can then be used or compared to historical impedance data over time to determine the relative change in impedance among one or more historical impedance values, as well as to identify the condition or health status of the structure 1000 or portion thereof to determine if maintenance of the transmission line support structure 1000 or portion thereof is required. In some embodiments, the currently measured impedance value and/or historical impedance values can be analyzed using known statistical methods to generate predictive data regarding the projected remaining operating life of the structure 1000 or portion thereof. Alternatively, the impedance value measured at one tower or structure may be compared to the impedance value one or more other towers to ascertain the health condition of the tower being evaluated. As a result, if the analysis of the impedance indicates that the structure 1000 or portion thereof is experiencing structural wear that exceeds a predetermined threshold, the structure 1000 or portion thereof can then be physically inspected and repaired as necessary. It should also be appreciated that due to the wireless capabilities of the system 10, remotely located technicians are able to readily carry out impedance monitoring without going into the field to perform such tests. Furthermore, because the system 10 also identifies the location of the structure 1000 under evaluation, technicians are readily able to locate the structure 1000 to perform any needed maintenance. It should also be appreciated that the impedance data may be analyzed in combination with one or more of humidity, temperature and pressure collected from the sensors 156-158, as well as data collected from any other sensor provided by the system 10 to generate data reflecting the current or predicted structural health of the structure 1000.

Thus, using the system 10, a baseline model or value of the electrical impedance of a transmission line support structure or tower structure 1000 can be determined. Accordingly, as the tower 1000 ages and is subjected to environmental conditions or physical damage, such as through purposeful structural tampering, changes in the electrical impedance of the tower 1000 or portions thereof can be detected, and can be used to calculate a maintenance merit or metric for the tower. For example, gusset 1074 is bolted to connect components 1055, 1056, and 1060 in FIG. 7C. Removal of the bolts, or the gusset itself introduces a measurable change in the electrical impedance of the tower 1000 to which it is attached, and such change can be used to alert technicians of a potential tower structural integrity issue.

Other tower integrity issues, such as caused by fatigue or corrosion, can be detected by determining a tower impedance change relative to other towers located at an adjacent location, and experiencing similar stresses, such as wind or ice loads.

To demonstrate that an impedance model of tower structural integrity can provide relevant information, a simplified structure comprising individual electrically conducting structural elements that are combined into a tower structure was modeled. FIG. 8A shows such an example of an abstracted transmission tower, 800, showing only one panel of the structure of a tower. The panel of tower 800 is comprised of a series of vertical members (V1-V-18) lateral member (L1-L14) and diagonal member (D1-D-18). In one embodiment, to identify the tower impedance, the conducting leads of the voltage component of the impedance sensor 182/660 would be attached to two respective locations on such a structure, for instance at the junction of (V5, V9, L6, D7, D9) as indicated by the arrow marked with +/− indicating applied voltage, and at the junction of (L6,D7,D10, V10,V6), as also indicated by the arrow marked with +/− indicating applied voltage. Following the introduction of a given AC voltage of a suitable frequency, an AC current flow is measured by the current measuring component, such as that designated as "M", whereupon the relative impedance of the structural member between the conducting leads may calculated by the computing unit 150 or other computing unit in communication with the system 10. Because the conducting components of the structure would be energized, the relative impedance provides information regarding the energized structure.

As proof of the operation of the impedance model for structural integrity, a simulated tower 810 was constructed, as shown in FIG. 8B. The model structure was intended to simulate a simplified tower structure, while allowing for introduction of electrical faults. The impedance of the structure could be measured and monitored when faults were introduced. For purposes of this model structure, faults were introduced by 10 disconnecting elements, with the disconnection of elements altering the electrical conductivity of the structure. The legs comprised four elements of approximately 1 cm angles, 6.4 m long, attached to diagonals of 64 cm×51 cm×4.8 meters, and cross bars of 64 cm×51 cm×4.8 meters. Table 1 shows the measured impedance resulting after introduction of faults.

TABLE 1

Impedance measured after faults

| Fault Position | Voltage | Current | R (μΩ) | R w/bus (μΩ) | Var. (%) |
| --- | --- | --- | --- | --- | --- |
| No Fault | 1 | 3.2315 | 308.9580 | 403.1447 | 0.0 |
| Leg 18 | 1 | 3.1861 | 313.3632 | 407.5498 | 1.0 |
| Leg 18/Leg 17 | 1 | 3.1689 | 315.0598 | 409.2464 | 2.0 |
| Leg 15 Diag 22-23 | 1 | 3.1608 | 315.7119 | 405.3008 | 2.2 |
| SC leg 20/Leg 21 | 1 | 3.2772 | 304.6501 | 398.8368 | 1.4 |
| Same fault both sides | 1 | 3.3071 | 301.8988 | 396.0854 | 2.2 |
| Leg 18, 17 with Diags. | 1 | 2.0253 | 348.5829 | 442.7695 | 12.8 |
| Leg 19, 22 With Diags. | 1 | 0.8771 | 804.8494 | 899.0360 | 160.5 |

Legend Table 1: Fault position: location as shown in FIG. 8B where fault introduced in tower 810; Voltage: applied AC voltage; Current: measured current draw of connected electrically conducting structure of tower 810. R: measured impedance in micro ohms; R with Bus bar: measured impedance in micro ohms with connected bus bar included; and Var. (%): percent variation of impedance compared to no fault condition.

Through additional modeling and field testing, the introduced impedance deviations increased to a higher relative value when structural alterations to the tower 810 were introduced at a distance closer to the location of the introduced impedance measuring signal. Thus, for a signal generator at near ground level, the addition of a new conducting member at the first tower node reduces the relative impedance by about 20%, while the addition of an additional member at the second node above the sensor reduces impedance by about 3%. Likewise, the effect of the conductivity of introduced elements affects the relative impedance, with highly conductive elements reducing the relative impedance more than less conductive elements added at the same position.

The location of the any given sensor system with impedance monitoring on a tower is expected to have an effect on the measured impedance upon initial installation, but the relative impedance is detected by the sensor system is stable for a given structure. Following installation and stabilization of relative impedance measurements, identification of new changes in relative impedance of a tower structure is considered a hallmark of the system, allowing alerts to be triggered when a change in relative impedance measured by an impedance sensor system reaches a predetermined critical value.

The placement of a sensor system or impedance detector 182/660 on a tower is not expected to be as critical as the separation of location at which a signal, such as the AC current signal, is introduced for measuring impedance. The impedance detector 182/660 of the system 10 can accommodate one or more locations for introduction of a query signal or AC current signal. The impedance detector 182/660 and/or system 10 may be placed higher on a structure, where power may be more readily harvested, or where it is inaccessible to those who may be tempted to tamper with the apparatus, however, the induced AC current signal may be input, and/or impedance measured at an adjacent, or somewhat distant location of the structure. Such measurements from the impedance detectors 182/660 may be communicated by wired connection or alternatively wirelessly to the system 10.

Figure 9D:
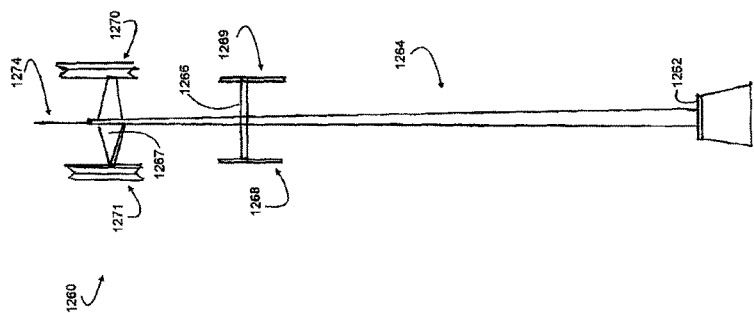
Figure 9A:
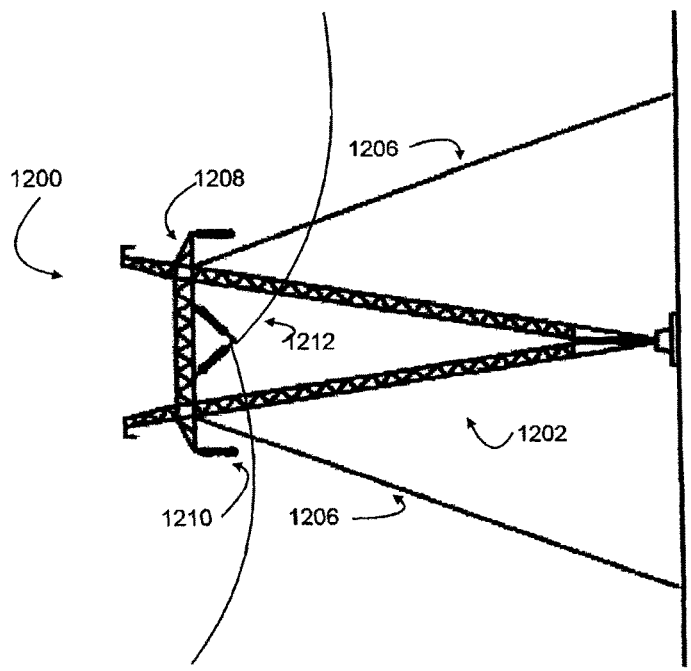

In light of the demonstration of the nature of the impedance detector 182/660 and its utility in monitoring towers for unexpected alterations, consideration of the range of transmission tower structures is important. FIGS. 9A-D show certain other common transmission tower designs for which the system 10 may be used. For example, in FIG. 9A shows a guyed pylon 1200 formed of steel lattice, with tower 1202, stayed by guy cables 1206, attached to conductor arm 1208, supporting insulator column 1210, and conductor 1212. FIG. 9B shows a steel tube tower 1213 with a single leg 1220 fixed to foundation 1222 at base plate 1224, attached to a steel conductor arm 1226 and supporting insulator column 1228, and conductor 1230. FIG. 9C shows a transmission tower 1240 formed primarily of wood elements, such as poles 1242 and 1244, holding conductor arm 1246 and suspending three insulator columns 1248 and three conductors 1250. It should be appreciated that the impedance sensor 182/660 is not as sensitive for structures with limited electrical conductivity. When non-electrically conducting structures are used, a ground cable is commonly installed, connecting one or more of the transmission tower structural elements to be impedance tested to a ground element, such as element 1252 disposed upon the supporting earth 1254. A non-conducting tower can be implemented with breakaway or partially fracturable conductive ground elements, such as connector box 1256. Thus, if the transmission tower formed of non-conductive structural members, such as wood, is damaged, an electrically significant change in impedance is made to the fracturable conductive ground element, which is detected by the impedance detector 182/660. While the impedance sensor 182/660 is particularly adaptable for electricity transmission towers, such impedance sensor 182/660 and system 10 can also be used on any electrically conductive structures in which an assessment of its structural health is desired.

In another example, FIG. 9D shows a cellular telephone tower 1260 that is comprised of a number of electrically conducting elements. A number of the tower integrity features described herein can be readily applied to such structures that are electrically conducting, or connected to electrically conducting elements. Mast 1260 has a base plate 1262, spar section 1264, and two antenna cross arms 1266, 1267, supporting antennas 1268-1271. In many installations, a lightning arrestor, as at 1274 is provided. For an antenna with a metal (i.e. electrically conducting) spar section, the base plate is grounded to a pedestal, such as pedestal 1276. If the spar portion is formed of wood or composite composition, typically, a conducting element (not shown) connects the electrically conducting appliances with the arrestor 1274 and a grounded element, such as a pedestal like 1276.

A system 10 and associated impedance sensor 182/660 is intended for installation to monitor unexpected structural changes to electrically conducting structural elements. In its simplest iteration, the tower integrity sensor uses an impedance measurement to monitor the structural integrity of the transmission line support structure or tower. The electrically conducting structural elements forming the tower structure are excited with an AC (alternating current) voltage signal. In some embodiments, the frequency of the applied AC voltage signal may be of any suitable frequency, and the amplitude of such AC voltage signal may be any suitable amplitude, such as a low voltage. In some embodiments, the voltage amplitude may be about 1 volt for example. The current flow into the tower structure induced by the applied AC voltage signal allows for the calculation of the impedance, as well as relative impedance, of various electrically conducting elements of the structure. In one embodiment, the voltage AC signal is propagated at a high frequency (and at a frequency distinct from the frequency of electric current being transmitted through the energized conductors associated with the tower). Measurement of the impedance or relative impedance can provide an expected impedance for a particular tower structure, and such relative impedance can be compared to the measured impedance at similar towers or historical impedance values collected over time. In addition, if the system 10 is left in place, the impedance or relative impedance can be measured continuously, such as in real-time, or at predetermined, discrete time intervals, or at other intervals as may be convenient or at random intervals, with changes in relative impedance noted for review.

The monitoring sensor system described may also be embodied in an alert method to alert technicians of changes in tower impedance over a particular time interval that exceed a predetermined threshold value. Electrically conducting structural components are widely used in the construction of high voltage electric transmission towers, and in related distribution structures. The most common material for such structures are mild steel shapes, steel tubes, and wooden poles. A variety of other metal alloys, non-metallic elements and the like are also used. Depending on the structural configuration of these towers, the material used in construction and their configuration, a particular tower structure presents a predictable impedance. Measuring the impedance over time, whether continuously or at discrete intervals allows for the detection of changes in impedance and subsequent correlation of impedance changes with structural changes of the tower from the original conditions, or other baseline condition.

It should be noted that for towers that include non-electrically conducting elements, an electrically conducting element can be attached, and used to monitor the integrity of non-conducting portions. If a non-conducting structure is disturbed by physical damage, or vandalism for instance, careful design of a connected conducting element allows for its controlled fracture upon the receipt of physical damage, thereby allowing the detection of the disturbance of the connected conducting elements through the impedance detector 182/660.

The system 10 may also utilize existing utility communication infrastructure or in place at transmission substations to communicate exception reports (i.e., predicted faults, incipient faults or actual faults) on individual structures and equipment. In addition, a nodal network may also be created through use of the sensor modules themselves, such that a mesh network is in operation so that monitoring information can be transmitted from sensor to sensor, e.g., tower to tower, leapfrogging to the nearest utility data concentrator for transmission to the utility control center.

About 30% of non-weather related electric system outages occur when equipment fails. These failures are predictable through radio frequency (RF) emissions. Since about 2010, the U.S. transmission grid has averaged 171 major electrical disturbances per year on the transmission grid that affected an average of 19.3 million customers. The frequency of these transmission system outages is increasing. Outages on the bulk transmission system reduce the power available for the entire grid including to the distribution system.

The distribution system has numerically many more outages, but with smaller impact on customer number or elements of the grid that are affected. However, approximately 80% of all electric power outages are attributed to the distribution system. The complexity and breadth of the 4 million miles of the U.S. distribution system presents the greatest challenge in monitoring and outage avoidance.

Figure 10:
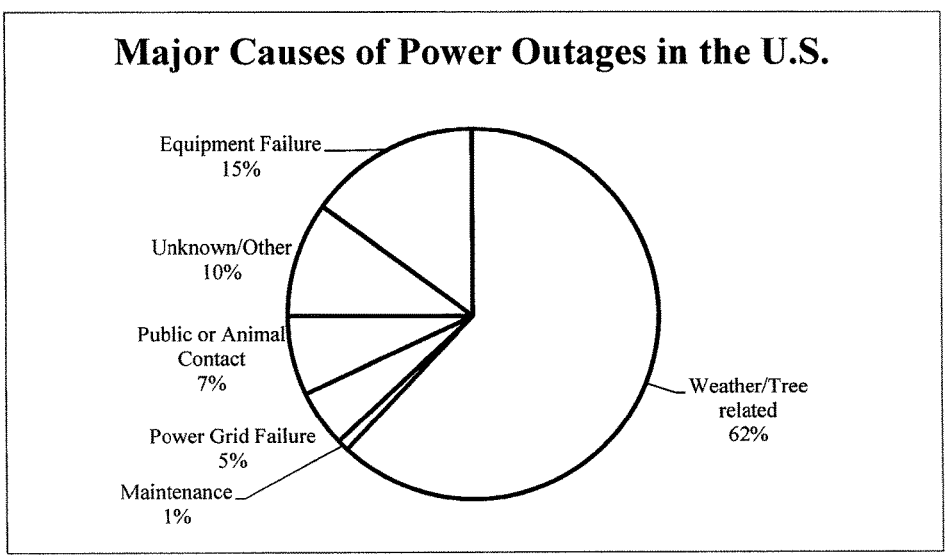
FIG. 10 is a chart identifying the causes of power outages.

FIG. 10 categorizes recent causes of power outages in the U.S. It should be noted that most of these outages are in the distribution network. Equipment failure and structural failure are the largest non-weather causes of outages. Equipment failure is responsible for about 15% of all outages. On many occasions, weather related failures are related to structural failure or intrusion.

Outages on the distribution system fall into five major categories: weather-related, equipment-related, vegetation-related, animal encroachment, and others. Weather is related to 50% of all distribution outages and is unavoidable, except to the extent that weather triggers a fault in a stressed component. When weather is removed from outage causes, equipment-related outages make up 31% of the remaining avoidable outages, the largest category.

The system 10 is embodied to provide intelligent sensors for fault detection that can monitor the condition of the electric utility grid and predict equipment incipient failure and locate equipment faults of transmission line support structures or towers. The individual sensors coupled to the detection and communication system implements sensors to allow scheduled maintenance of tower structures or other monitored structures to avoid faults and reduce outage duration by locating predicted faults.

A fully configured transmission tower structure sensor (Tower sensor) can continuously monitor all elements of the tower for emissions that would indicate insulator contamination, line hardware deterioration, and surge arrester deterioration. Data indicating increased probability of incipient failure conditions and faults can then be transmitted to the utility over a given network.

Figure 11:
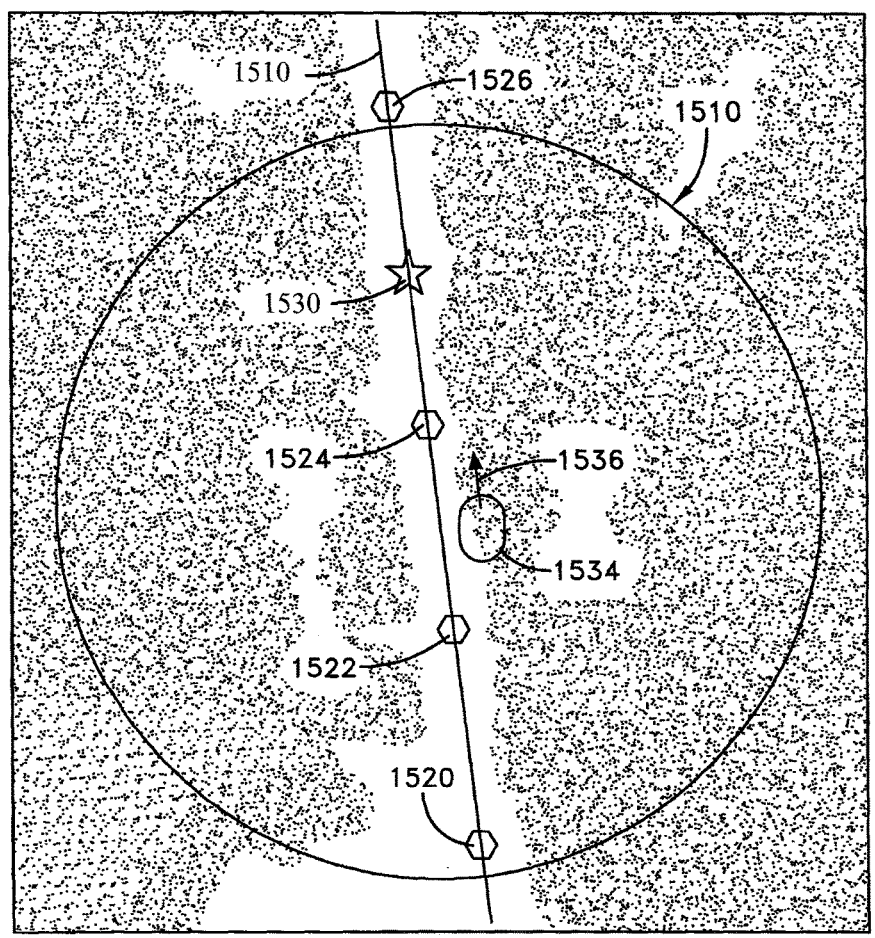
FIG. 11 is an image of a map indicating areas of concern in the distribution system, and identifying individual components of the distribution system that may require maintenance.

The system 10 may also be utilized in an area of concern (AOC) analysis. AOC analysis comprises a first level of survey analysis to localize potential maintenance targets where sensor data is not complete. This allows users to compare measured fault indication data to poor circuit performance data for immediate action and further High Definition Structure Analysis (HDSA) with deteriorated equipment photographs. After completing an AOC survey, a graphic display may be used, as shown in FIG. 11, which shows an aerial map diagram 1500 displaying a short segment of the electric grid system. Transmission line 1510 passes diagonally across the map 1500, and is supported by a series of transmission towers shown as hexagons 1520-1526. One tower is indicated as a star 1530. A vehicle, such as a drone 1534, passes along line 1510 in the direction of arrow 1536. A vehicle, such as car 1534 may query a series of tower sensor station is shown as blue lines. Detected areas of concern are shown as Red overlays. Further, the AOC analysis can be displayed as trend information to discover and display potential fault problems developing.

It is an object of the present disclosure that the system 10 can be mounted on each tower structure. In addition, the system 10 may be disposed within any suitable case or housing, such as the housing 12 shown in FIGS. 2 and 3 for example. In some embodiments, the system 10 and case may be substantially miniaturized. In particular, such cases may be weatherproof, such as that shown in FIG. 2.

It is a preferred embodiment that the system 10 communicate with a remote computer system or with another system 10, or that multiple sensors, such as impedance sensors 182 communicate with the system 10, wirelessly over a linear, low power, peer-to-peer communication network, or communicate with a communications hub, or respond to broadcast queries to provide data on demand.

In another embodiment, maintenance alerts may be triggered by predetermined criteria, whereupon such alerts are be transmitted to the electric utility, for instance, from the linear peer-to-peer network to a suitable uplink data concentration device. Such uplink device may use cellular, satellite, or any other provided network interface technology, whether the interface is provided by the system itself by a utility, or by a third party. Thus, the system can be configured to create maintenance predictions on the peer-to-peer network and communicate actionable maintenance alerts and information to the utility.

Figure 12:
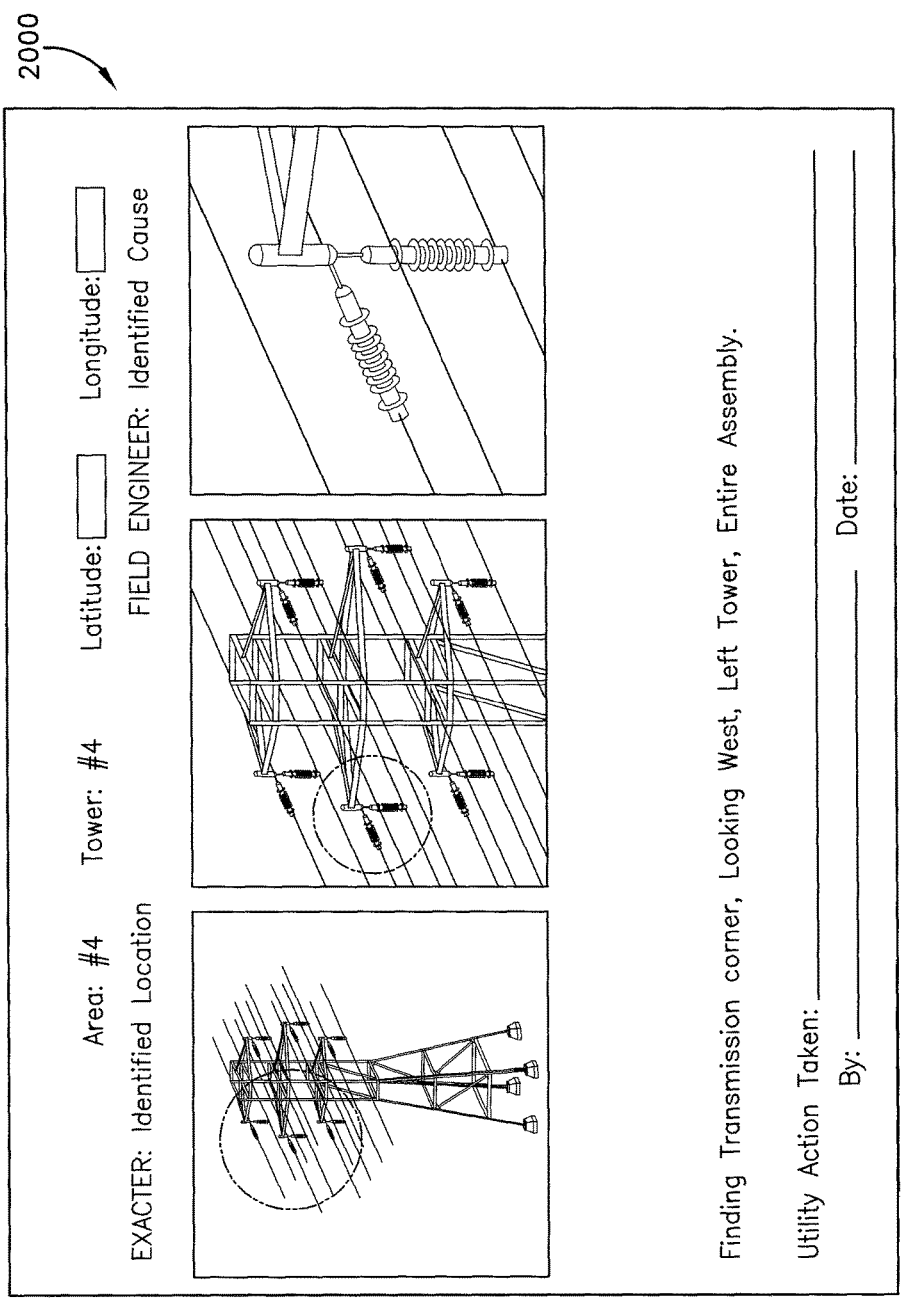
FIG. 12 is an example of a report created through data collected by the system for use by technicians.

The system can provide separately, or as an adjunct to AOC analysis, High Definition Structure Analysis (HDSA), which provides a second level of indication display, in the form of detailed survey analysis. To provide HDSA, typically, in a low sensor density area, the projected fault zone is surveyed, for instance by air. The flight path is monitored over the HDSA Analysis Area, and repetitive studies provide statistically significant results predicting the location of deteriorated equipment. Thus, after HDSA, components can be displayed with indicators of maintenance location prediction probability or fault condition. As shown in FIG. 11, after detailed HDSA, individual components can be called out for maintenance scheduling. As shown in FIG. 12, a linked report 2000 can be created that allows for details to be provided to maintenance supervisors and technicians.

The condition monitoring system 10, as disclosed herein, can be configured to broadcast status, such as over a wired or wireless network, or to respond to a polling system that queries the tower sensors at predetermined or irregular intervals. In addition, the system 10 can be optionally configured to announce a status report upon the reaching of a determined status trigger.

When sensors, such as sensors 156-158 and 182 are placed on towers in convenient geographic locations, the transmission tower status can be queried by using a vehicle to travel in a vicinity of the tower sensor, so that sensor reports and additional tower status data can be obtained at the same interval. For instance, tower sensors placed within one mile of a roadway can be queried by a mobile unit that is driven by a vehicle to the vicinity of a transmission towers. If roadways are not available, the tower sensors can be queried by a mobile unit carried by an airplane, helicopter, drone, remote controlled vehicle, or other aircraft, or on an all terrain vehicle (ATV), motorcycle, horse or even a technician carrying a mobile unit on foot. The present disclosure is directed to a sensor apparatus for use individually, or with a power circuit fault management network. In particular, the sensors, particularly the impedance detector 182, disclosed herein is directed to identifying faults in conductors of electric power systems, particularly transmission line support structures. Such conductor faults include damage that occurs during installation of conductors, during routine maintenance, arising from degradation during use, or due to an insult to the conductor arising from the environment.

A salient feature of the method and system 10 resides in its application to monitor through use of a portable device that is transported through the locality of the fixed location sensors. In essence, when transported by a vehicle (such as an automobile or aircraft) about a desired geographic region, the portable monitoring system can signal the sensor to be activated and to transmit sensor data to the monitoring apparatus.

All terms not specifically defined herein are considered to be defined according to Webster's New Twentieth Century Dictionary Unabridged, Second Edition. The disclosures of all of the citations provided are being expressly incorporated herein by reference.

Thus, it can be seen that the objects of the present invention have been satisfied by the structure and its method for use presented above. While in accordance with the Patent Statutes, only the best mode and preferred embodiments have been presented and described in detail, with it being understood that the present invention is not limited thereto or thereby.

The invention claimed is:

1. The method for detecting and generally locating incipient faults of a structural component of an electrical power delivery system exhibiting a fundamental fault indicator and located at a given position, comprising the steps:
   providing a detector alert assemblage including a sensor input antenna, a computer controllable radio receiver having a data output, and a receiver providing position data;
   propagating a signal through an electrically conducting element of a structural component in order to measure the impedance of a structure; determining a relative impedance of a structure by measuring current flow; monitoring a segment of electricity conductor support structures using a propagated signal and comparing said segment of support structures to signals from related structures;
   determining a fault signature through a relative change in impedance; receiving and processing said fault indicator output; and detecting said signal values and classifying them as to fault probability to provide classified signal values, with position data to provide position associated fault probability values and submitting them to said fault storage function.

2. The method of claim 1 in which:
   said detector alert assemblage is capable of detecting faults about a structural element capable of carrying an electrical signal.

3. The method of claim 2 further comprising a structural element that is one or more of an electricity transmission support tower, an electricity distribution conductor support pole, a power pole, a pipeline, a pipe, or a structural alloy member.

4. The method of claim 1 further comprising a fault indicator output that is one or more of impedance, resistance, load and EMF emission.

5. The method of claim 2 further comprising:
   a fault data storage server configured to receive said compiled fault probability value and position data from a communications network; and a modem within said housing controllable by said control computer to communicate said compiled merit values and position data to said fault data storage server.

6. The method of claim 1 in which:
   power is supplied to the detector alert assemblage by a storage battery electrical power supply that is charged by one or more of an inductive charger, a solar charger, a wired transformer, and a turbine generator.

7. The method of claim 3 in which said system further comprises: a weather sensing assemblage having an environmental status output providing ambient temperature, humidity or barometric pressure; and said control computer is responsive to submit said environmental status output to said storage facility in conjunction with the submittal of said compiled merit values and position data.

8. A system for detecting and generally locating incipient faults at a component of an electrical power delivery system exhibiting a fundamental fault indicator and located at a given segment of electricity conductor, comprising: a signal receiving assemblage, a computer controllable radio receiver having a data output, and a receiver providing position data; including at least one sensor input antenna, a first computer controllable radio receiver operatively coupled with said antenna having a first amplitude detected output, a second computer controllable wideband radio receiver operatively coupled with said antenna having a second amplitude detected output, and a positioning system providing position data; an isolated segment of electricity conductor;
   propagating a test signal along a segment of electricity conducting element;
   receiving and processing a fault indicator output for detecting signal values and classifying them as to fault probability to provide classified signal values, with position data to provide position associated fault probability values; a signal converter responsive to said first propagated frequency amplitude output to convert it to digital form at a sampling rate to provide fault related parameter samples;
   a signal processor configured for extracting narrow band signal frequencies therefrom that are harmonically related to said fundamental frequency, analyzing said signals to derive maintenance merit values; and a control computer including a digital storage facility and responsive when a said fault related parameter maintenance merit value is below a setpoint; and submitting maintenance merit values to said fault storage function; and utilizing such compiled data for alerting of an incipient fault.

9. The system of claim 8, wherein said detector alert assemblage is capable of detecting faults about a structural element capable of carrying an electrical signal.

10. The system of claim 9 in which:
    said control computer is responsive to submit said digital samples as raw data to the storage facility to develop a signature analysis capability.

11. The system of claim 8 further comprising:
a fault data storage server configured to receive said compiled maintenance merit values and GPS position data from a communications network; and a modem controllable by said control computer to broadcast compiled maintenance merit values and position data to said fault data storage server.

12. A sensor for identifying or locating service incident faults relating to a structural component of an electrical power delivery system exhibiting a fault indication at a position, comprising the steps:
   a) a detector alert assemblage including a sensor input antenna, a computer controllable radio receiver having a data output, and a receiver providing position data;
   b) a signal emitter for propagating a current flow signal through one or more electrically conducting elements associated with the structural component
   c) measuring the impedance of electrically conducting elements associated with the structure by propagating a current flow signal;
   d) recording a relative impedance of said conducting elements by measuring relative current flow signal for a given voltage;
   e) monitoring the relative impedance of the structural component over time;
   f) determining a fault signature associated with a change in relative impedance;
   g) receiving and processing said fault signature; and
   h) detecting said fault signatures and classifying them as to fault probability to provide classified signal values, correlated with position data to provide position associated fault probability values and submitting them to said fault storage function, so that a position related fault probability can be utilized to determine the location of a service incident.

13. The sensor of claim 12 further comprising monitoring a segment of electricity conductor support structures using a propagated signal and comparing said segment of support structures to signals from related structures.

14. The sensor of claim 12 further comprising the service incident is one or more of a structural failure, a structural degradation, a structural alteration resulting from human intervention, an electromagnetic phenomenon, and a weather event.

15. The sensor of claim 12 further comprising a sensor that is mounted on one or more of a high voltage transmission tower, a transmission tower, a electrically connected network on a non-conducting structure, a metal electricity pole, a wooden pole with a conducting element attached, an antenna, a radio antenna, and a cellular telephone antenna.

* * * * *